(12) United States Patent
Rush et al.

(10) Patent No.: US 10,356,945 B2
(45) Date of Patent: Jul. 16, 2019

(54) SYSTEM AND METHOD FOR THERMAL MANAGEMENT USING VAPOR CHAMBER

(71) Applicant: GENERAL ELECTRIC COMPANY, Schenectady, NY (US)

(72) Inventors: Brian Rush, Niskayuna, NY (US); James William Sears, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 15/228,336

(22) Filed: Aug. 4, 2016

(65) Prior Publication Data
US 2017/0064868 A1    Mar. 2, 2017

Related U.S. Application Data

(63) Continuation-in-part of application No. 14/592,387, filed on Jan. 8, 2015.

(51) Int. Cl.
H05K 7/20    (2006.01)
B22F 3/11    (2006.01)
(Continued)

(52) U.S. Cl.
CPC ....... *H05K 7/20336* (2013.01); *B22F 3/1055* (2013.01); *B22F 3/1103* (2013.01);
(Continued)

(58) Field of Classification Search
CPC ............. H05K 7/2039; H05K 7/20672; H05K 7/20292–7/20336; H05K 7/20809;
(Continued)

(56) References Cited

U.S. PATENT DOCUMENTS

| 4,771,365 A | 9/1988 | Cichocki et al. |
| 5,227,957 A | 7/1993 | Deters |

(Continued)

FOREIGN PATENT DOCUMENTS

| CN | 104776740 A | 7/2015 |
| DE | 2826998 C1 | 6/1995 |

(Continued)

OTHER PUBLICATIONS

M. Ameli et al., "A novel method for manufacturing sintered aluminium heat pipes (SAHP)", Applied Thermal Engineering, vol. 52, Issue 2, pp. 498-504, Apr. 15, 2013.

(Continued)

*Primary Examiner* — Zachary Pape
(74) *Attorney, Agent, or Firm* — Peter A. Flynn

(57) ABSTRACT

In accordance with one aspect of the invention, a thermal management system for electronics includes a vapor chamber that at least partially envelops the electronics, a working fluid contained within the vapor chamber and used to dissipate heat from a part of a heated portion of the electronics and a precision sintered 3D wick structure independently created on some of the interior of the vapor chamber. The precision sintered 3D wick structure transports the working fluid by capillary action from at least one working fluid receptacle to a part of the heated portion of the electronics. In one embodiment of the invention, the 3D vapor chamber may be formed by the additive manufacturing processes. A further example includes precision sintered 3D support structures integrated into the closed 3D vapor chamber. The support structures mainly facilitate to support the 3D closed vapor chamber envelope from collapsing during operation, and add overall structural strength and additionally facilitate transfer of liquids and gas through their internal 3D porous zones.

18 Claims, 28 Drawing Sheets

(51) Int. Cl.
  *B22F 3/105* (2006.01)
  *B33Y 80/00* (2015.01)
  *F28D 15/04* (2006.01)
  *F28D 15/02* (2006.01)
  *G06F 1/20* (2006.01)

(52) U.S. Cl.
  CPC .......... *B33Y 80/00* (2014.12); *F28D 15/0233* (2013.01); *F28D 15/046* (2013.01); *G06F 1/20* (2013.01); *H05K 7/20672* (2013.01); *B22F 2003/1058* (2013.01); *B22F 2999/00* (2013.01); *F28F 2255/18* (2013.01); *G06F 2200/201* (2013.01); *Y02P 10/295* (2015.11)

(58) Field of Classification Search
  CPC .............. H05K 1/0203; H05K 7/20381; F28D 15/046; F28D 15/0233; G06F 1/20; G06F 2200/201; F28F 13/003; F28F 2255/18; B33Y 80/00; H01L 23/427
  USPC .......... 361/700, 719; 165/80.4–80.5, 104.33; 257/714–714
  See application file for complete search history.

(56) References Cited

U.S. PATENT DOCUMENTS

| | | | |
|---|---|---|---|
| 5,439,351 A | 8/1995 | Artt | |
| 5,579,830 A | 12/1996 | Giammaruti | |
| 5,720,338 A * | 2/1998 | Larson | F28D 15/0241 165/104.26 |
| 5,975,841 A | 11/1999 | Lindemuth et al. | |
| 6,233,150 B1 | 5/2001 | Lin et al. | |
| 6,349,760 B1 * | 2/2002 | Budelman | H01L 23/427 165/104.33 |
| 6,359,218 B1 | 3/2002 | Koch et al. | |
| 6,392,883 B1 | 5/2002 | Ali | |
| 6,430,931 B1 | 8/2002 | Homer | |
| 6,624,349 B1 | 9/2003 | Bass | |
| 6,631,755 B1 | 10/2003 | Kung et al. | |
| 6,793,009 B1 * | 9/2004 | Sarraf | F28D 15/02 165/104.26 |
| 6,889,755 B2 * | 5/2005 | Zuo | F28D 15/046 165/104.21 |
| 7,002,247 B2 * | 2/2006 | Mok | H01L 23/427 257/625 |
| 7,189,064 B2 | 3/2007 | Helder et al. | |
| 7,256,992 B1 | 8/2007 | Stewart et al. | |
| 7,369,410 B2 | 5/2008 | Chen et al. | |
| 7,377,098 B2 | 5/2008 | Walker et al. | |
| 7,473,995 B2 | 1/2009 | Rumer et al. | |
| 7,594,537 B2 | 9/2009 | Hou et al. | |
| 7,836,597 B2 * | 11/2010 | Datta | F04B 17/00 165/104.33 |
| 7,900,438 B2 | 3/2011 | Venkataramani et al. | |
| 7,907,409 B2 * | 3/2011 | Wyatt | H05K 7/20809 165/104.26 |
| 7,928,562 B2 | 4/2011 | Arvelo et al. | |
| 8,047,269 B2 | 11/2011 | Kang et al. | |
| 8,176,972 B2 * | 5/2012 | Mok | F28D 15/02 165/104.26 |
| 8,466,486 B2 | 6/2013 | Yuan | |
| 8,475,112 B1 | 7/2013 | Ryznic et al. | |
| 8,549,749 B2 | 10/2013 | Zimbeck et al. | |
| 8,616,834 B2 | 12/2013 | Knight, III et al. | |
| 8,656,722 B2 | 2/2014 | Norris et al. | |
| 8,937,384 B2 | 1/2015 | Bao et al. | |
| 9,476,651 B2 | 10/2016 | Thiagarajan et al. | |
| 2002/0021556 A1 | 2/2002 | Dibene, II et al. | |
| 2003/0043547 A1 | 3/2003 | Nealis | |
| 2004/0074630 A1 * | 4/2004 | Sen | H01L 23/433 165/46 |
| 2006/0042224 A1 | 3/2006 | Shiao et al. | |
| 2007/0012429 A1 | 1/2007 | Siu | |
| 2007/0040702 A1 * | 2/2007 | Mosher | B64G 1/10 340/943 |
| 2008/0170368 A1 * | 7/2008 | Chen | F28D 15/0233 361/701 |
| 2009/0040726 A1 | 2/2009 | Hoffman et al. | |
| 2010/0065255 A1 * | 3/2010 | Liu | F28D 15/025 165/104.26 |
| 2010/0181048 A1 * | 7/2010 | Hwang | F28D 15/0233 165/104.26 |
| 2010/0200199 A1 | 8/2010 | Habib et al. | |
| 2010/0320187 A1 | 12/2010 | Griffin et al. | |
| 2011/0209864 A1 | 9/2011 | Figus et al. | |
| 2011/0232877 A1 * | 9/2011 | Meyer, IV | F28D 15/0266 165/104.26 |
| 2012/0192574 A1 | 8/2012 | Ghoshal et al. | |
| 2012/0206880 A1 * | 8/2012 | Andres | H01L 23/4275 361/700 |
| 2012/0227926 A1 | 9/2012 | Field et al. | |
| 2012/0250259 A1 | 10/2012 | Lee et al. | |
| 2012/0331269 A1 | 12/2012 | Aras | |
| 2013/0189594 A1 | 7/2013 | Breit et al. | |
| 2013/0213610 A1 * | 8/2013 | Wu | F28D 15/0233 165/104.26 |
| 2013/0236299 A1 * | 9/2013 | Kington | F02C 7/10 415/177 |
| 2013/0268085 A1 * | 10/2013 | Dong | A61F 2/28 623/23.5 |
| 2013/0327504 A1 * | 12/2013 | Bozorgi | F28D 15/04 165/104.26 |
| 2014/0083653 A1 * | 3/2014 | Kempers | F28F 13/04 165/104.26 |
| 2014/0090808 A1 | 4/2014 | Bessho et al. | |
| 2014/0169981 A1 * | 6/2014 | Bales | B22F 5/04 416/96 R |
| 2014/0174086 A1 | 6/2014 | Kare et al. | |
| 2014/0190667 A1 | 7/2014 | McGlen et al. | |
| 2014/0202665 A1 * | 7/2014 | Paschkewitz | F28D 15/02 165/104.26 |
| 2014/0268831 A1 * | 9/2014 | Shih | F21V 29/51 362/382 |
| 2014/0284020 A1 | 9/2014 | Amir et al. | |
| 2015/0000871 A1 * | 1/2015 | Farner | H05K 7/20681 165/104.21 |
| 2015/0027669 A1 | 1/2015 | Kokas et al. | |
| 2015/0040888 A1 | 2/2015 | Zakhidov et al. | |
| 2015/0237762 A1 * | 8/2015 | Holt | H05K 7/20336 165/104.21 |
| 2015/0285501 A1 * | 10/2015 | DiCintio | F23R 3/14 60/740 |
| 2015/0289413 A1 | 10/2015 | Rush et al. | |
| 2015/0375340 A1 * | 12/2015 | Cui | B29C 67/0077 428/188 |
| 2016/0069622 A1 * | 3/2016 | Alexiou | G06F 1/1656 165/146 |
| 2016/0123678 A1 * | 5/2016 | Hulse | F28D 15/02 165/104.21 |
| 2017/0067693 A1 | 3/2017 | Rush et al. | |

FOREIGN PATENT DOCUMENTS

| | | |
|---|---|---|
| DE | 102011086786 B3 | 3/2013 |
| GB | 2476253 A | 6/2011 |
| TW | I289655 B | 11/2007 |
| WO | 2009120613 A1 | 10/2009 |
| WO | 2013097031 A2 | 7/2013 |

OTHER PUBLICATIONS

Wu et al., "Investigation of the polymer wick structure applied to loop heat pipe", 2009 4th International Microsystems, Packaging, Assembly and Circuits Technology Conference, pp. 368-371, Oct. 21-23, 2009, Taipei.

Brown et al., "Thermal Management Issues and Evaluation of a Novel, Flexible Substrate, 3-Dimensional (3-D) Packaging Concept", 1998 International Conference on Multichip Modules and High Density Packaging, pp. 135-140, Apr. 15-17, 1998.

(56) References Cited

OTHER PUBLICATIONS

Rawal et al., "Thermal Management for Multifunctional Structures", IEEE Transactions on Advanced Packaging, vol. No. 22, Issue No. 3, pp. 379-383, Aug. 1999.

Hara et al., "Optimization for Chip Stack in 3-D Packaging", IEEE Transactions on Advanced Packaging, vol. No. 28, Issue No. 3, pp. 367-376, Aug. 2005.

European Search Report and Written Opinion issued in connection with related EP Application No. 15162670.2 dated Aug. 24, 2015.

European Search Report and Written Opinion issued in connection with related EP Application No. 16165250.8 dated Sep. 14, 2016.

Brian Magann Rush et al., Jan. 8, 2015, U.S. Appl. No. 14/592,387.

William Dwight Gerstler et al., Apr. 15, 2015, U.S. Appl. No. 14/686,799.

Gu, D.D., et al., "Laser additive manufacturing of metallic components: materials, processes and mechanisms," International Materials Reviews, vol. 57, No. 3, pp. 1-33 (2012).

Stoffregen, H.A., et al., "Selective Laser Melting of Porous Structures," pp. 680-695 (2011).

Yap, C.V., et al., "Review of selective laser melting: Materials and applications," Journal of Applied Physics, vol. 2, No. 4, pp. 1-21 (2015).

Extended European Search Report and Opinion issued in connection with corresponding EP Application No. 17184526.6 dated Nov. 29, 2017.

Mochizuki et al., "A Review of Heat Pipe Application Including New Opportunities", Frontiers in Heat Pipes, pp. 1-15, 2011.

Robak., "Latent Heat Thermal Energy Storage with Embedded Heat Pipes for Concentrating Solar Power Applications"University of Connecticut Digital Commons, pp. 1-68, Apr. 24, 2012.

Green et al., "Dynamic Thermal Management of High Heat Flux Devices using Embedded Solid-Liquid Phase Change Materials and Solid State Coolers", 13th IEEE ITHERM Conference, pp. 853-863, 2012.

Yogev et al., "PCM Storage System with Integrated Active Heat Pipe", Energy Procedia, vol. No. 49, pp. 1061-1070, 2014.

Winter., "Engineers' Guide to Military, Aerospace & Avionics", Extension Media, pp. 1-44, 2014.

"Subracks", Pixus Technologies, Retrieved from http://www.pixustechnologies.com/products/enclosure-system-solutions/subracks/?gclid=CKS30uaLjsUCFYMpjgodzIMA8g, pp. 1-13, Aug. 24, 2017.

De Bock et al., "Circuit Card Cartridge For An Electronic System", GE Co-pending U.S. Appl. No. 15/237,054, filed Aug. 15, 2016.

The EP Office Action received Dec. 21, 2018 for corresponding application No. 17 184 526.6-1103.

\* cited by examiner

Flip

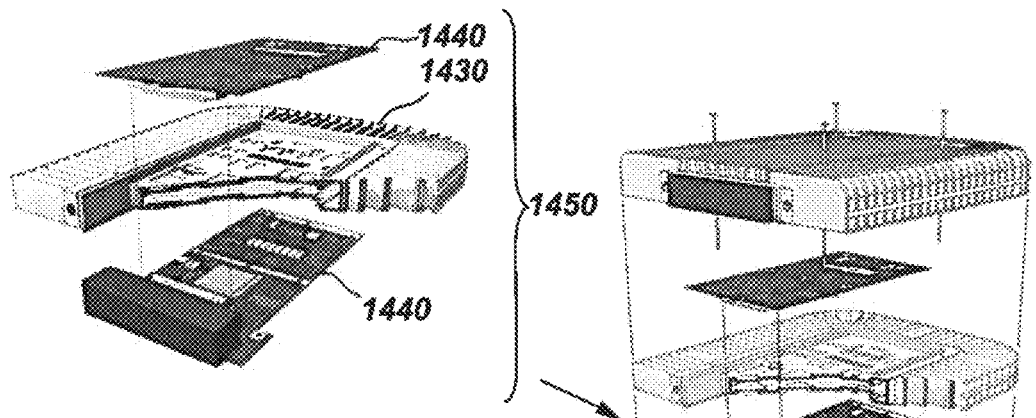
Fig. 14A
Fig. 14B
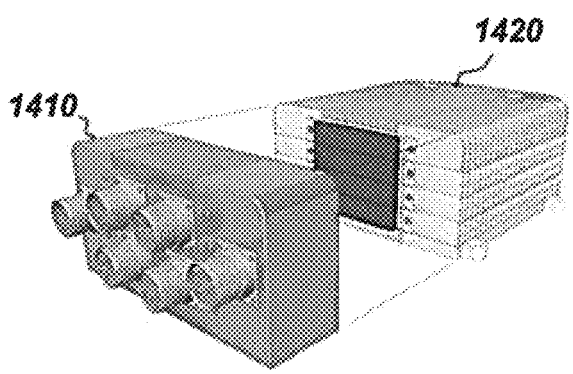
Fig. 14C
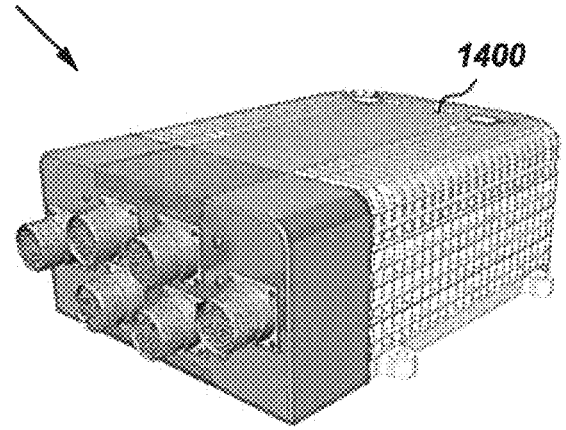
Fig. 14D

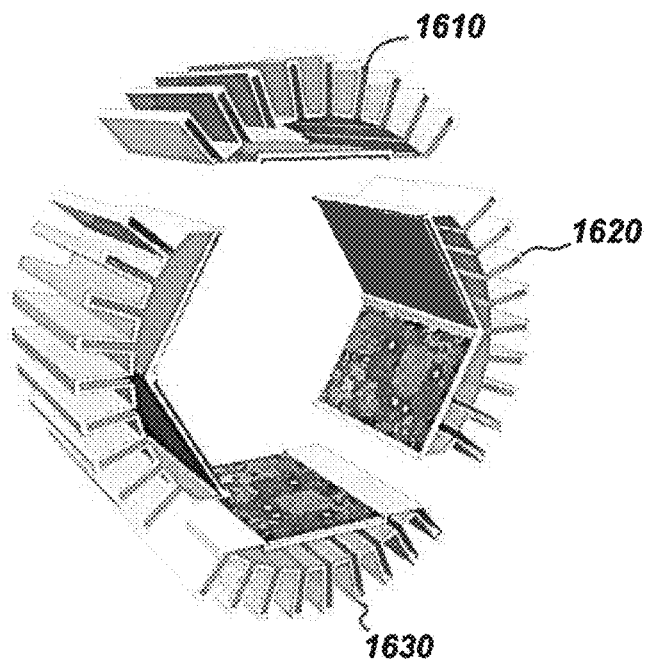
*Fig. 16A*
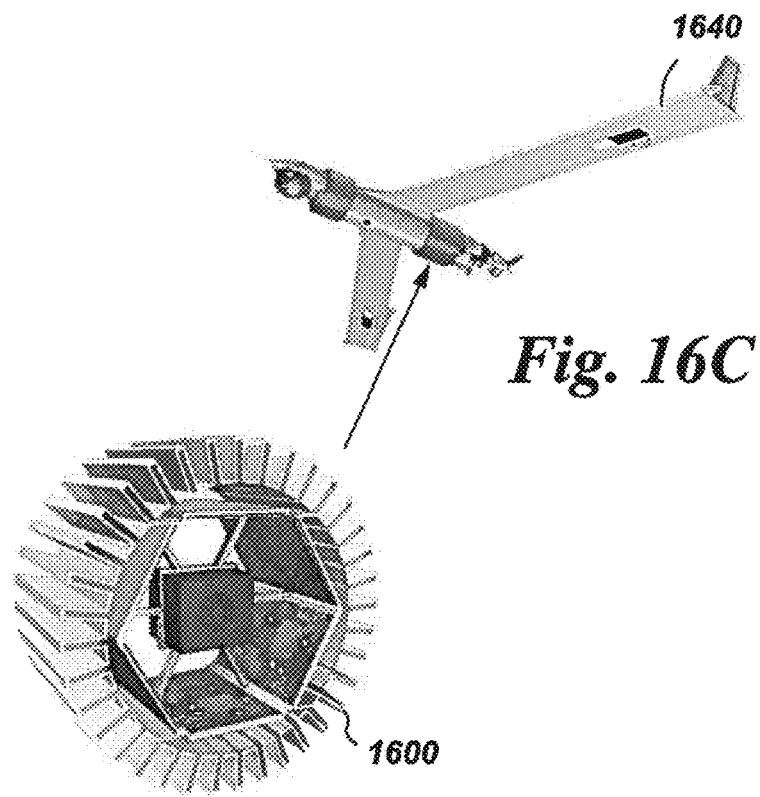
*Fig. 16B*
*Fig. 16C*

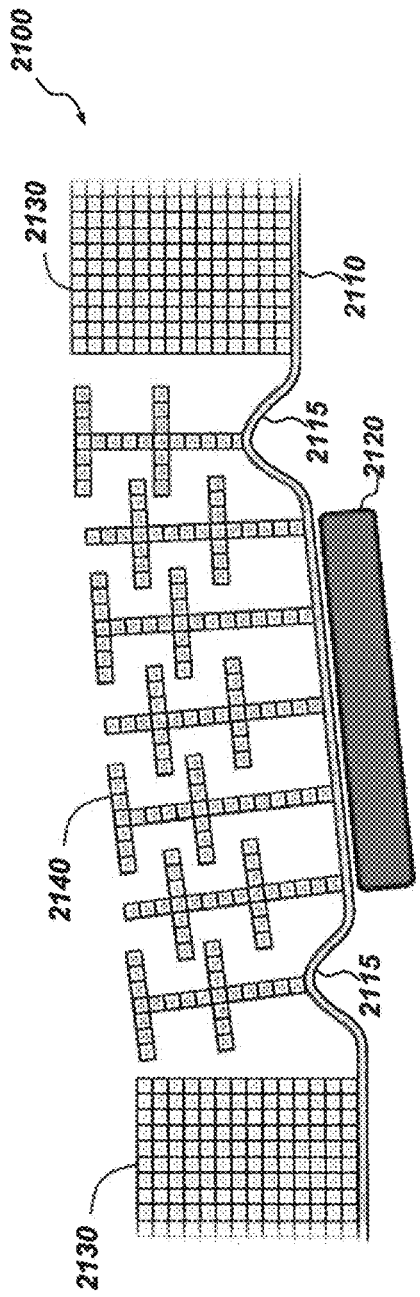
Fig. 21A
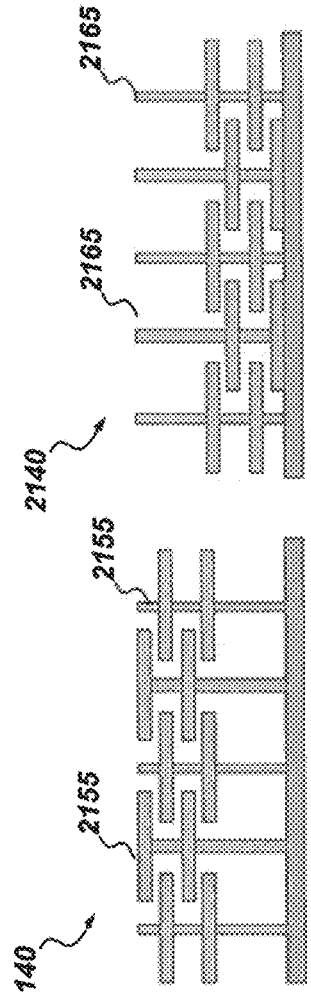
Fig. 21B
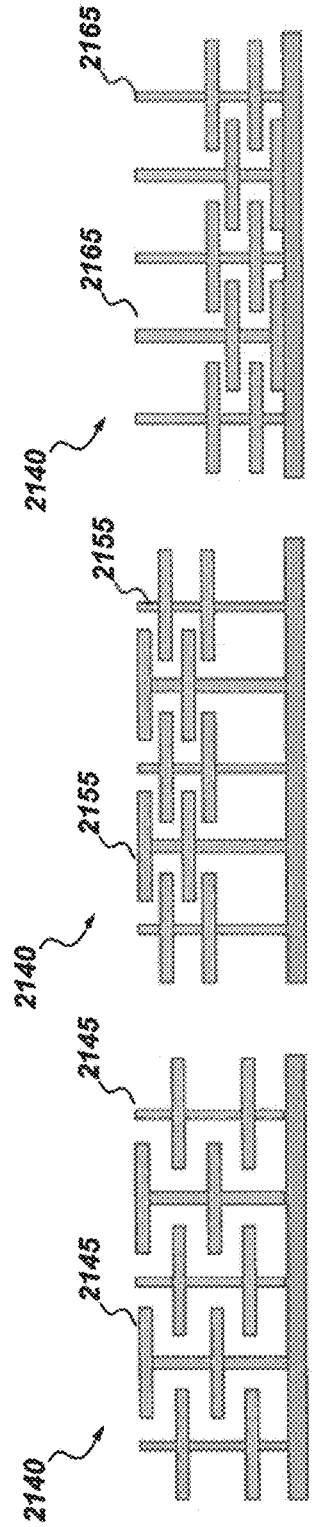
Fig. 21C
Fig. 21D

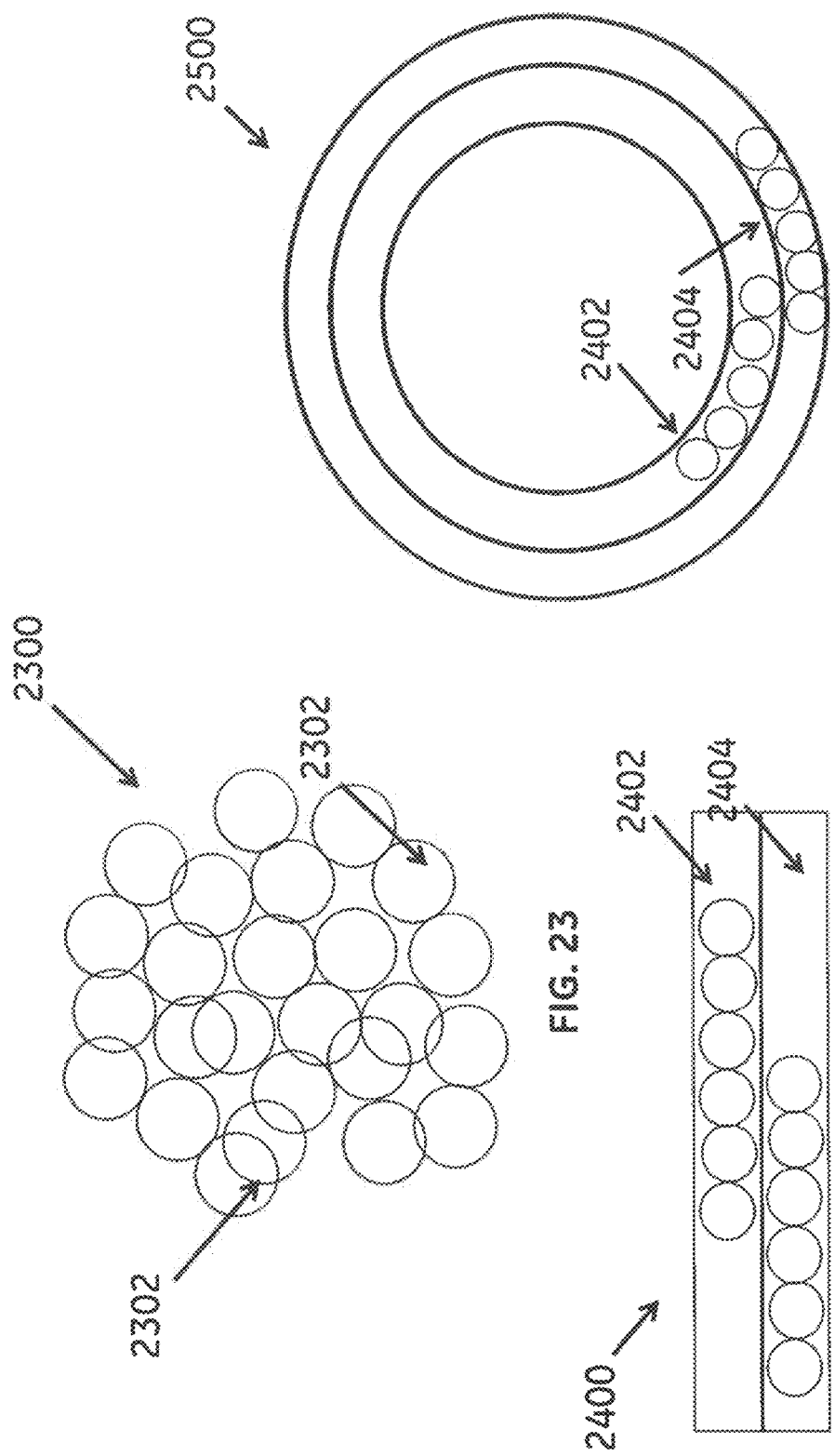

| Laser Parameter | (Solid) Wall Setting | (Porous) Wick Setting |
|---|---|---|
| Spot Diameter [um] | 100 | 100 |
| Power [W] | 170 | 90-130 |
| Speed [mm/s] | 1250 | 2000 |
| Spacing [um] | 100 | 160-200 |
| Layer-to Layer Angle [deg] | 45 | 90 |

FIG. 32

SYSTEM AND METHOD FOR THERMAL MANAGEMENT USING VAPOR CHAMBER

CROSS REFERENCE TO RELATED APPLICATION

This application is a Continuation-In-Part (CIP) Application of commonly assigned, U.S. patent application Ser. No. 14/592,387, entitled "SYSTEM AND METHOD FOR THERMAL MANAGEMENT USING VAPOR CHAMBER", filed on Jan. 8, 2015, the contents of which are hereby incorporated by reference in their entirety.

STATEMENT REGARDING FEDERALLY SPONSORED RESEARCH & DEVELOPMENT

This disclosure was made with Government support under contract number N66001-15-C-4002 awarded by the Defense Advanced Research Projects Agency (DARPA), Defense Sciences Office (DSO). The Government may have certain rights in this invention.

BACKGROUND

The operation of electronic devices requires satisfactory thermal management to ensure proper function. As the electronic devices become heated, the devices suffer from device degradation, functional failure, and lower lifespan.

For example, the capability of avionics electronics is determined by the computing processing ability of the system. Typically, there are size and weight constraints for an avionics system. These systems are thermally limited such that, for a given volume, only a certain number of cores or processors can operate before thermal issues such as overheating occurs. Typically, processors are de-rated (up to 80%) to avoid overheating in high ambient temperature environments—drastically reducing capability. If the heat can be effectively removed from the system, more processing power, and ultimately more processing capability, is possible from the same volume and weight.

There are a number of conventional cooling methods such as fans and heatsinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

Some improved advances include heat pipes and synthetic jet cooling. Heat pipes provide for some efficiency improvements in the thermal characteristics whereas synthetic jets essentially provide for improved reliability relative to fans.

System designers have increasingly recognized that the thermal management is a critical factor to the successful deployment of electronics and currently design assemblies and systems in order to optimize thermal performance.

The thermal path from the electronic component to the cold reservoir is limited by current technology. Certain conventional designs include the use of milled aluminum heat frames, composite materials for chassis and mounting electronics closer to the cold reservoir. Further aspects include integrating planar vapor chambers and linear heat pipes into a heat spreader structure.

What is needed to further enhance processing power and functionality is to improve the thermal performance.

SUMMARY

In accordance with one aspect of the invention, a thermal management system for electronics includes at least one vapor chamber that at least partially envelops the electronics, a working fluid contained within the vapor chamber and used to dissipate heat from at least a part of a heated portion of the electronics and a precision sintered 3D wick structure independently created on at least some of the interior of the vapor chamber, wherein the precision sintered 3D wick structure transports the working fluid by capillary action from at least one working fluid receptacle to the at least a part of the heated portion of the electronics. In further embodiments, any 3D vapor chamber formed by additive manufacturing processes as detailed herein is within the scope of the system. A further example includes precision sintered 3D support structures integrated into the 3D vapor chamber, wherein the support structures mainly facilitate to support the 3D closed vapor chamber envelope from collapsing during operation and additionally facilitate transfer of liquids and gas through their internal 3D porous zones.

In accordance with one aspect of the invention, a closed 3D vapor chamber formed by additive manufacturing, includes a working fluid contained within the vapor chamber and used to dissipate heat from at least a part of a heated portion of a number of electronics positioned in proximity of the vapor chamber, and a precision sintered 3D wick structure independently created on at least some of the interior of the vapor chamber, wherein the precision sintered 3D wick structure transports the working fluid by capillary action from the at least a part of the heated portion of the electronics to at least one working fluid receptacle. A further example includes precision sintered 3D support structures integrated into the 3D vapor chamber, wherein the support structures mainly facilitate to support the 3D closed vapor chamber envelope from collapsing during operation, and add overall structural strength and additionally facilitate transfer of liquids and gas through their internal 3D porous zones.

In accordance with yet another aspect of the invention, a method of thermal management for electronics, includes enveloping the electronics at least partially in at least one 3D vapor chamber formed by additive manufacturing, independently creating a precision sintered 3D wick structure on at least some of the interior of the vapor chamber; transporting a working fluid through the precision sintered 3D wick structure by capillary action, and dissipating heat from the at least a part of the heated portion of the electronics to at least one working fluid receptacle.

These and other aspects, features, and advantages of this disclosure will become apparent from the following detailed description of the various aspects of the disclosure taken in conjunction with the accompanying drawings.

DRAWINGS

Embodiments described herein will become better understood when the following detailed description is read with reference to the accompanying drawings in which like characters represent like parts throughout the drawings, wherein:

FIGS. 14A-14D shows stacked modular vapor chambers and assembly into avionics system with I/O module;

FIGS. 16A-16C shows modular vapor chamber in another embodiment that is integrated into the airframe skin;

FIGS. 21A-21F is another example of the modular vapor chamber with complaint wall and 3D wick structures;

Figure 26:
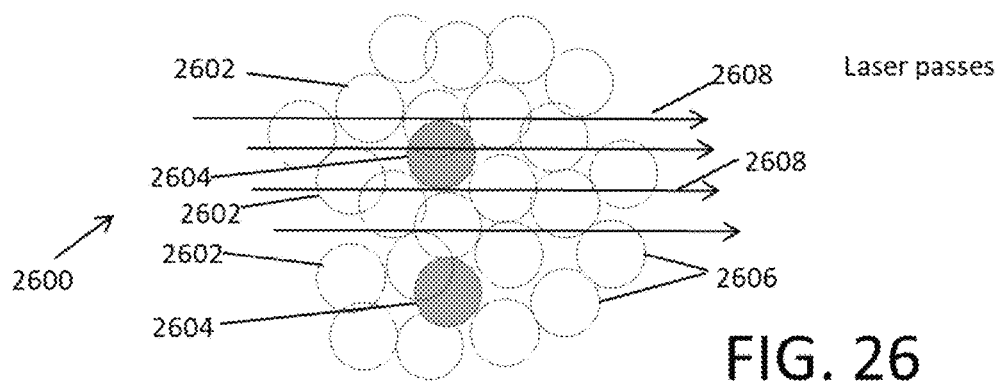
Figure 27:
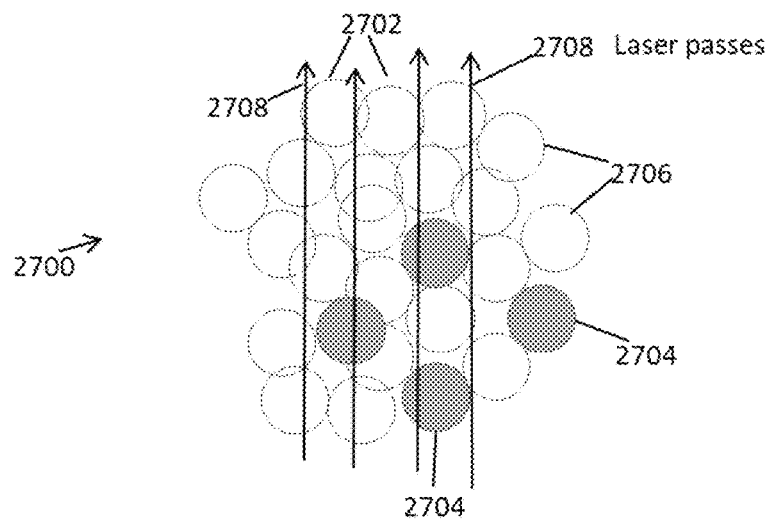
Figure 29:
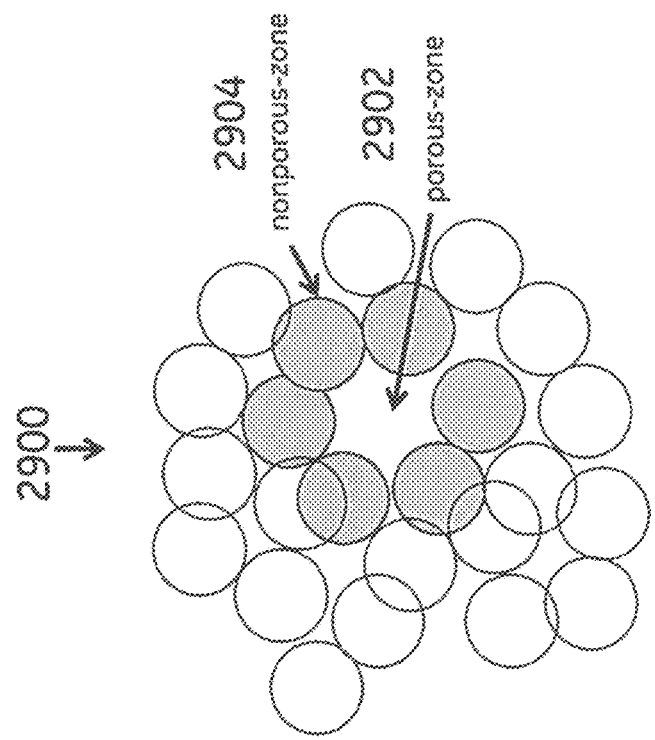
Figure 28:
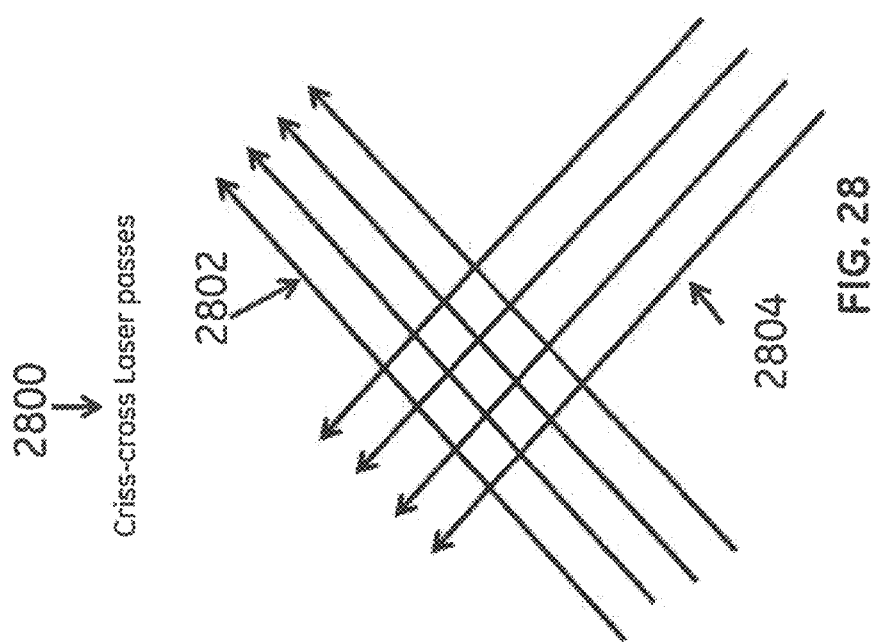
Figure 30:
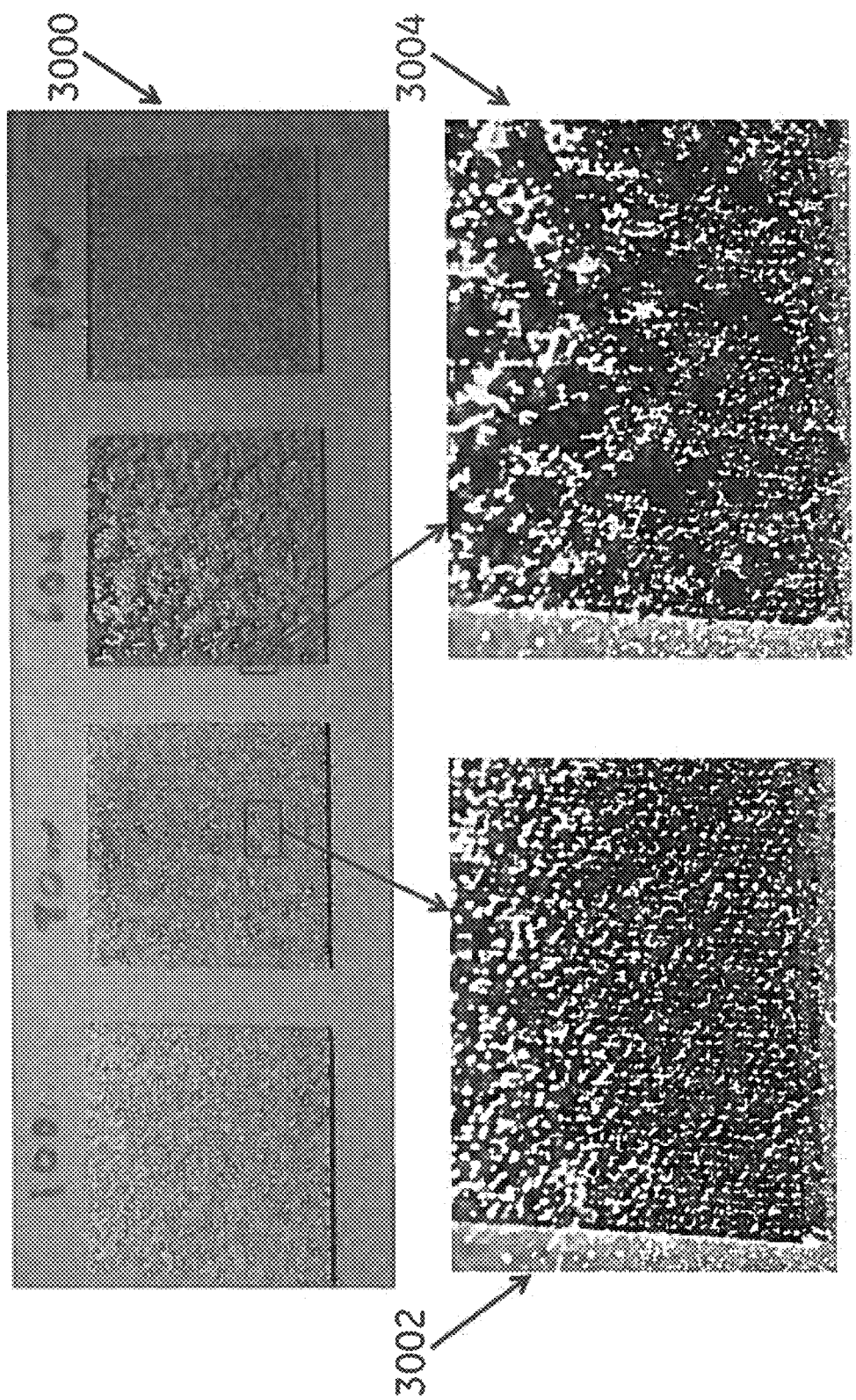
Figure 31:
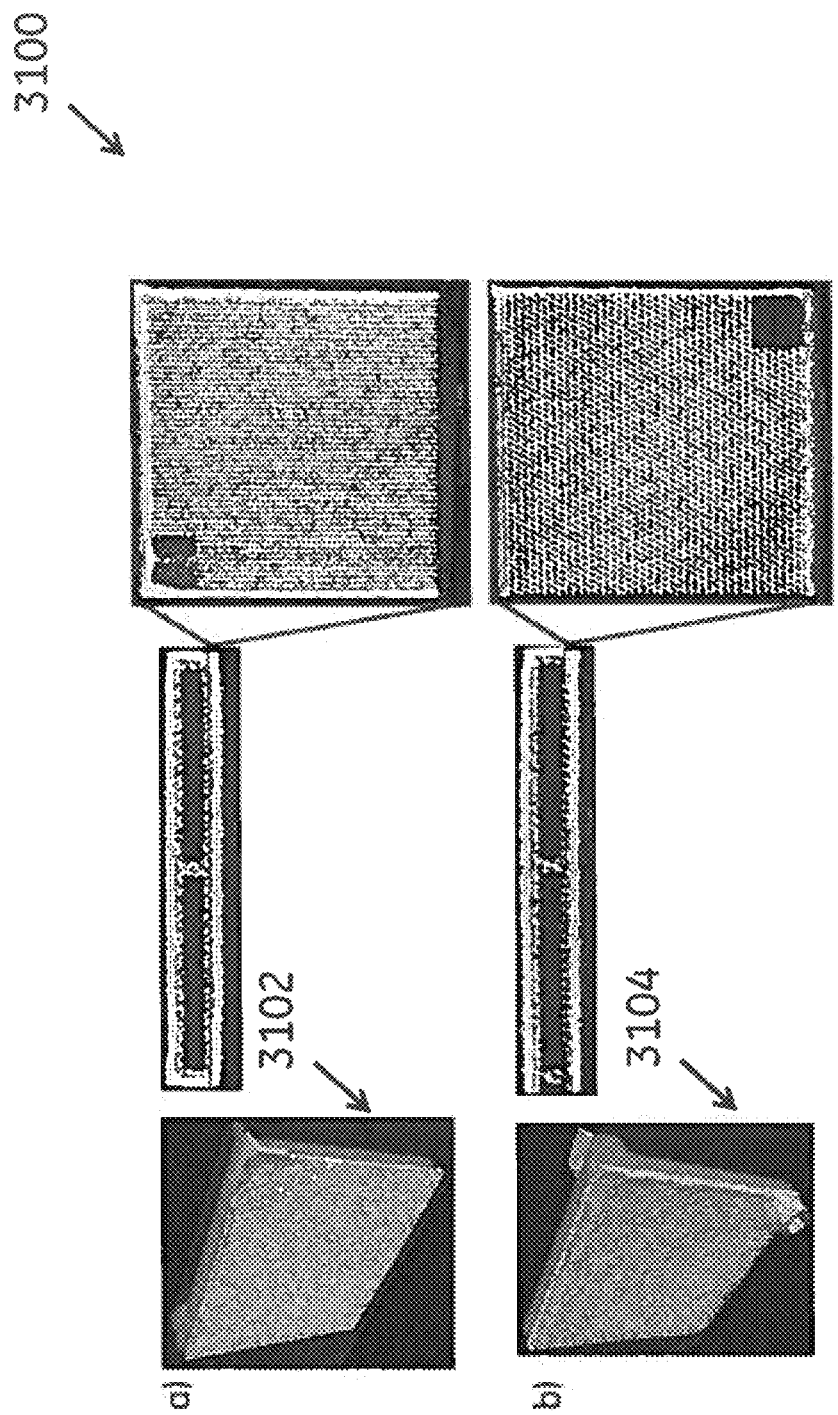
Figure 33:
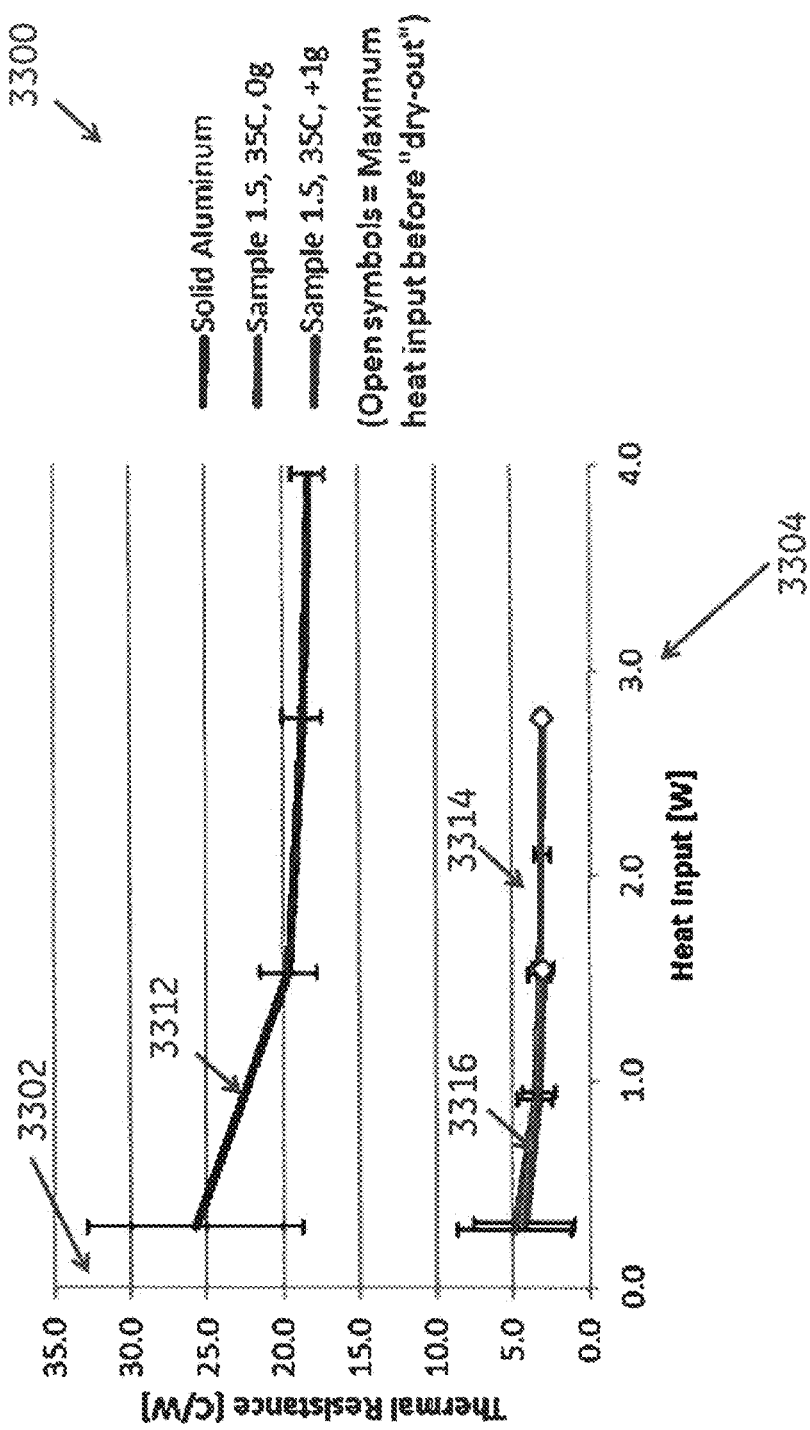
Figure 34:
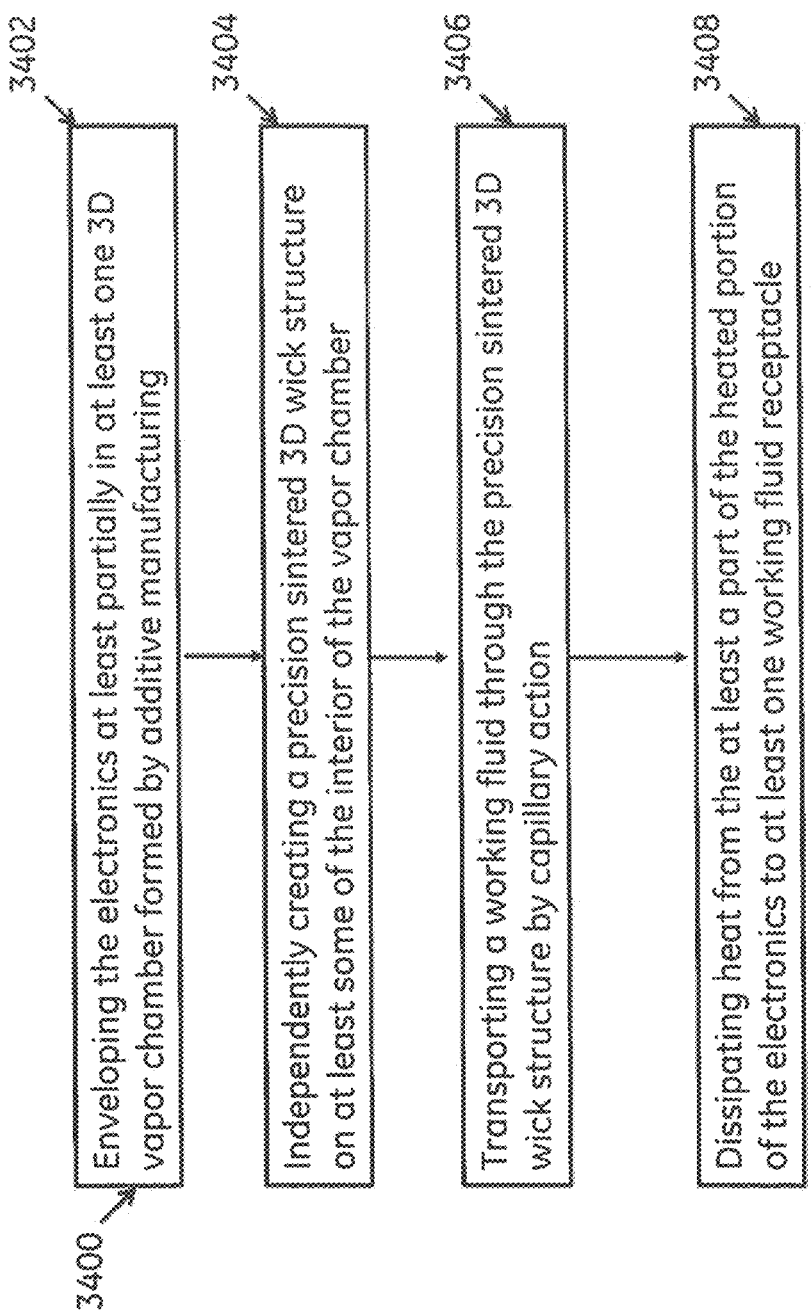

FIG. 23 schematically illustrates a top view of a collection of metal build powder particles, in accordance with one embodiment of the present invention;

FIG. 24 schematically illustrates a side view of the collection of metal build powder particles of FIG. 23, in accordance with one embodiment of the present invention;

FIG. 25 schematically illustrates a top view of the collection of metal build powder particles, of FIG. 23, in accordance with one embodiment of the present invention;

FIG. 26 schematically illustrates a top view of an exemplary first laser pass process applied to build a precision sintered 3D wick structure, in accordance with one embodiment of the present invention;

FIG. 27 schematically illustrates a top view of an exemplary second laser pass process applied to build a precision sintered 3D wick structure, in accordance with one embodiment of the present invention;

FIG. 28 schematically illustrates a top view of an exemplary crisscross laser pass process applied to build a precision sintered 3D wick structure, in accordance with one alternative embodiment of the present invention;

FIG. 29 schematically illustrates a top view of an exemplary cross-section of a precision sintered 3D wick structure, in accordance with one embodiment of the present invention;

FIG. 30 represents magnified top views of four exemplary cross-sections of a precision sintered 3D wick structure, in accordance with one embodiment of the present invention;

FIG. 31 represents comparison of two exemplary cross-sections of a precision sintered 3D wick structure, in accordance with one embodiment of the present invention;

FIG. 32 represents exemplary specifics of the laser parameters, in accordance with one embodiment of the present invention;

FIG. 33 represents comparison of measured thermal resistance vis-a-vis heat input for three representative samples, in accordance with one embodiment of the present invention; and FIG. 34 illustrates a method of thermal management, in accordance with one embodiment of the present invention.

DETAILED DESCRIPTION

Example embodiments are described below in detail with reference to the accompanying drawings, where the same reference numerals denote the same parts throughout the drawings. Some of these embodiments may address the above and other needs.

The thermal management system in one example describes a thermal management device comprising a sealed vessel that contains a working fluid. A specially engineered internal structure within the sealed vessel interacts with the working fluid to enhance the transfer of heat energy. The vessel is of a conformal, reverse-conformal or custom-conformal shape as required by the specific application. One part of the internal structure includes fine structures engineered to provide strong capillary forces to the working fluid at locations where they are required. Other parts of the internal structure include fine structures engineered to transport the working fluid with minimal pressure drop while preventing interference with the vapor state of the working fluid. Additional support structures, as part of the internal structure act to internally support and strengthen the sealed vessel, and thereby to provide additional paths for fluid transport. Working components, usually electronic, that generate parasitic heat losses are thermally connected to the thermal management system. In effect, the thermal management system establishes a specially engineered thermal path between the electronic components and a cold reservoir and thereby transfers the heat from the components to the cold reservoir.

Figure 1A:
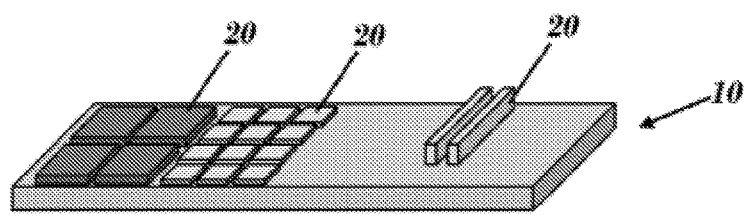
FIG. 1A and FIG. 1B shows a conventional circuit card assembly with electronic components on a circuit card mated to a heat frame.
Figure 1B:
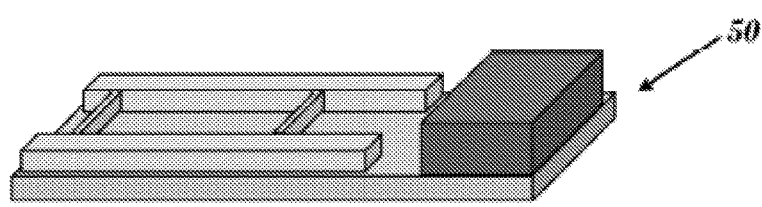

FIG. 1A and FIG. 1B shows a conventional circuit card assembly with electronic components on a circuit card mated to a heat frame. Referring to FIGS. 1A and 1B, a conventional circuit card 10 is shown in FIG. 1A with electronic components 20 that can include components such as processors that generate considerable heat. Referring to FIG. 1B, in many applications the circuit card 10 is coupled to a heat spreader card 50 by flipping the circuit card 10 and securing it to the heat spreader 50 so the components 20 are proximate the heat spreader 50. While this form of heat dissipation works to some degree, it can only dissipate a certain amount of heat generated by the components 20 and requires a large and bulky heat spreader 50. As the processing capabilities have increased, the individual components have decreased in size and require even greater heat dissipation capabilities in a smaller space.

Figure 2:
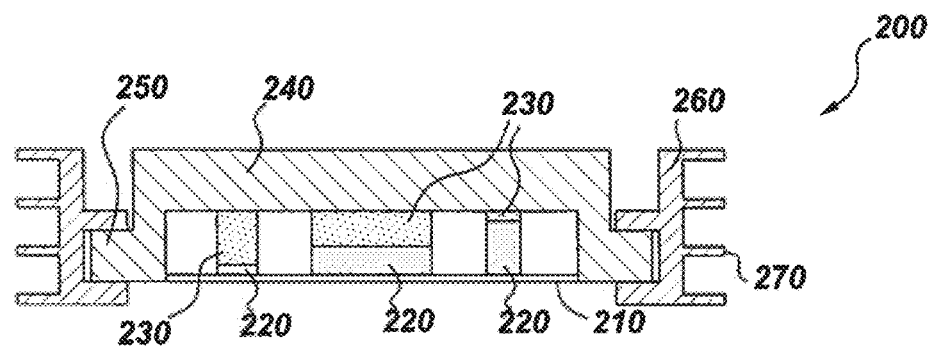
FIG. 2 depicts the conventional circuit card assembly including the electronic circuit card, heat spreader, wedge-lock, chassis and fins.

FIG. 2 depicts a conventional thermal management system 200 according to one example for an assembly (not shown). In such a conventional system, the components such as the heat frame or heat spreader 240 with wedgelock 250 and circuit card 210 coupled thereto are mated to the chassis frame 260 having fins 270. In the state of the art, electronic components 220 are mounted to a component board 210 such as a printed circuit card/board (PCB). The components 220 typically have a thermal interface material (TIM) 230 to transfer the heat from the components 220 to the heatframe 240, particularly since the components 220 may have different shape/size and the heatframe 240 is configured to allow for the highest component height. The heatframe 240 is typically constructed of a material such as aluminum to provide for efficient heat transfer of has a sufficient size to facilitate the heat transfer.

As noted in FIG. 2, components 220 generate heat that is conducted through TIM 230 to the heatframe 240. The heatframe 240 further spreads the heat to the wedgelock 250, to the chassis frame 260 and then to the fins 270. Thus, the heat is finally dissipated to the environment and fins 270 are designed to be large enough to dissipate the expected heat from the electronic components.

In some cases, the heatframe 240 can be quite large in comparison to the circuit card 210. The wedgelock 250 is used to seat the heatframe 240 (pre-assembled with the card 210) into the chassis frame 260 wherein the chassis frame 260 has a mating portion for the wedgelock 250, for example a chassis groove, to receive the wedgelock 250. The wedgelock 250, in certain examples, is a cam operated device that serves to lock the heatframe 240 to the chassis frame 260. Chassis frame 260 typically has fins 270 to allow for a greater surface area so the external environment that can include cooling air or liquid that removes the heat.

Figure 3:
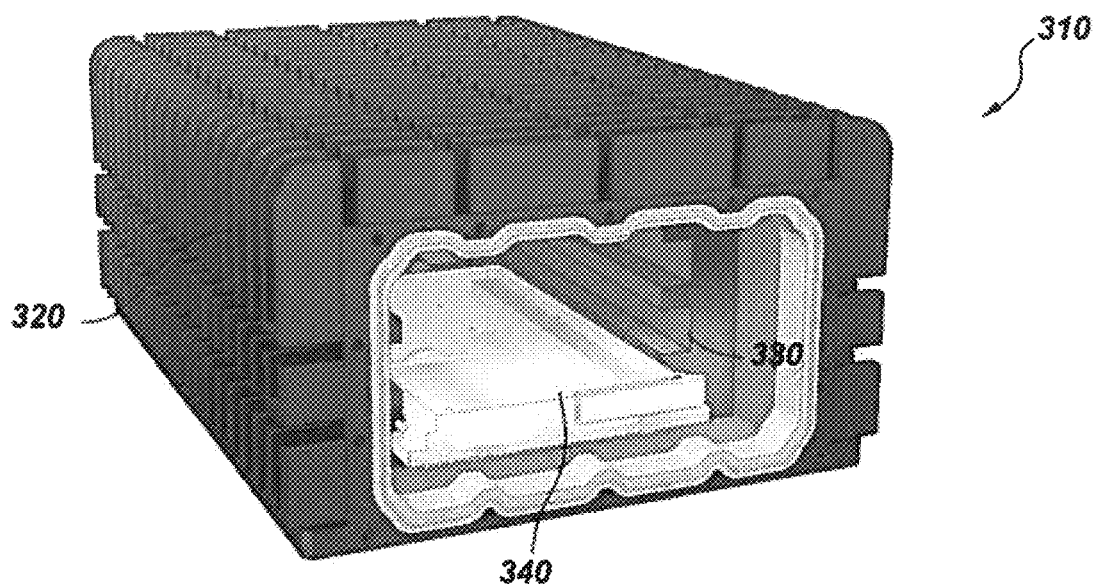
FIG. 3 shows a conventional chassis for housing circuit card assemblies.

FIG. 3 shows a conventional chassis for housing circuit card assemblies. Referring to FIG. 3, a chassis frame 310 is shown having a number of chassis grooves 330 for seating a number of circuit cards 340 with the heat spreaders and electronics. The chassis frame 310 has a network of chassis fins 320 about the perimeter of the chassis frame to provide for heat transfer, which is typically on three sides, such as right, left, and top. When there are multiple cards in the chassis frame, there may be considerable heat generated by the individual cards such that other heat transfer features such as heatpipes and vapor chambers may be utilized. In this example, the electronic circuit card is coupled to the heat spreader card which is then inserted into the chassis frame via the grooves using the wedgelock to secure the card assembly to the chassis frame.

Figure 4:
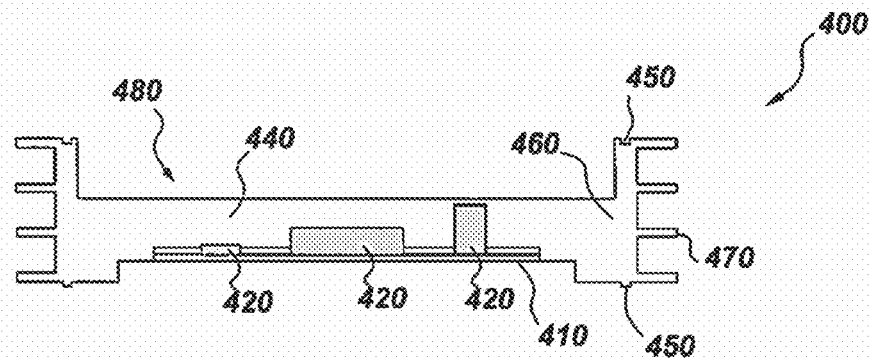
FIG. 4 illustrates one embodiment of the present system that includes an integrated assembly providing thermal management for an electronic circuit card.

FIG. 4 illustrates one embodiment of the present system that includes an integrated thermal management system for an electronic circuit card, wherein the integrated system is manufactured by additive manufacturing. As used herein, additive manufacturing refers to processing techniques such as 3D printing, rapid prototyping (RP), direct digital manufacturing (DDM), selective laser melting (SLM), electron beam melting (EBM), and direct metal laser melting (DMLM).

Referring again to FIG. 4, the integrated thermal management card assembly 400 in this example includes a heatframe 440, fins 470, card mounting portion 460 and chassis mounting portion 450 that are integrally formed as a unitary thermal management structure 480. In this example, the card mounting portion 460 integrally formed with the heatframe 440 removes the need for the wedgelock mating of the conventional assembly of FIG. 2. The card mounting portion 460 retains the printed circuit card 410 such as by friction fit and/or tongue and groove. The chassis mounting portion 450 is employed as part of the chassis architecture that is also used to seat circuit cards inserted in slots or channels. As part of ruggedizing this architecture, the mounting portion 450 ensures a friction fit in the chassis, so that the circuit cards do not shake loose from the backplane. It also provides pressure between the bottom of the card or heat frame and the chassis wall, thus creating a good thermal bond. In the depicted chassis architecture, the traditional wedgelock is superfluous as the elements are integrally formed and do not insert cards in slots, but stacks circuit cards as slices that are then retained to the I/O module via fasteners, thereby eliminating the traditional wedgelock.

In one example the heatframe 440 is a vapor chamber and the printed circuit card 410 with the accompanying components 420 are coupled to the vapor chamber. The printed circuit card 410 engages the heatframe 440 that is configured to receive the printed circuit card 410. In one example, the heatframe 440 includes a tongue and groove feature that follows the sides of the circuit card 410. The heatframe 440, in one example, is designed for the printed circuit card 410 and the accompanying heat generating component 420 such that the heatframe 440 is designed to be in close proximity to the components 420 on at least one side. In such an example, the thermal interface material is not required or can be minimized.

According to one embodiment, a further feature of the vapor chamber implementation is a reduction in the Electromagnetic Interference (EMI) of the assembly 480 which allows mating multiple assemblies while providing strong attenuation for EMI generated by the electronics or present in the external environment.

In addition, the heatframe 440 in one example is designed to be in close proximity for conductive coupling with not only the upper surface or top of the component 420 but in some examples on one or more sides of the component 420. The ability to effectuate heat transfer over a greater surface area of the components 420 greatly enhances the thermal management capabilities of the structure 480. In one example the heatframe 440 is conductively coupled to the top surface and at least one side surface of the component 420. As used herein, conductively coupled refers to being in direct, indirect or close proximity to a component such that heat transfer can occur. For the indirect contact, a material such as a thermal interface material can be utilized.

Thermal performance estimates using thermal resistance of the exemplary thermal management systems illustrated in FIGS. 4 and 6-18 with the 3D manufactured vapor chambers indicate they are superior to today's state of the art systems.

Figure 5:
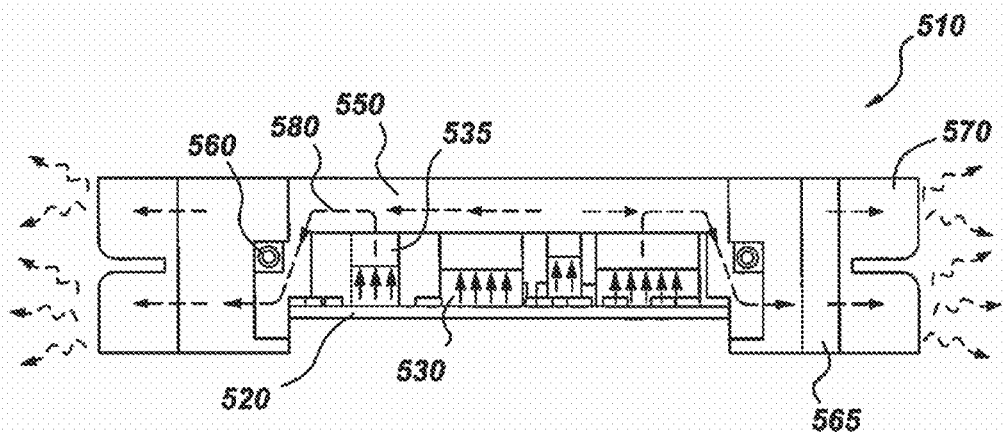
FIG. 5 shows the thermal flow path in a conventional chassis with attached circuit card assembly.

FIG. 5 shows the thermal flow path in a conventional chassis unit with attached circuit card assembly. Specifically, FIG. 5 is a cut away side perspective and depicts a conventional chassis unit 510 for a circuit card 520 having components 530 of varying size and shape and is secured to the chassis frame 565 by a wedgelock 560. The thermal flow path in a conventional chassis unit 510 comprising thermal interface material (TIM) 535, heatframe 550, wedgelocks 560 and chassis 565 with attached circuit card assembly. TIM 535 is typically used to conduct heat from the components 530 to the heat frame 550. At least some of the heat is conveyed by conduction 580 through the heat frame 550 to the chassis frame 565 and finally to the heat fins 570 and dissipated to the environment. The wedgelock 560 typically provides a mechanical camming mechanism that provides mechanical pressure forcing the heat frame 550 into intimate contact with at least one side of the groove in the chassis wall, ensuring mechanical retention of the heat frame 550 in the chassis unit 510 and acceptable thermal contact between the mating surfaces. The wedgelock 560 mechanism occupies space in the chassis wall and causes it to be thicker than it would otherwise be, increasing the size and weight of the overall chassis 510.

Figure 6A:
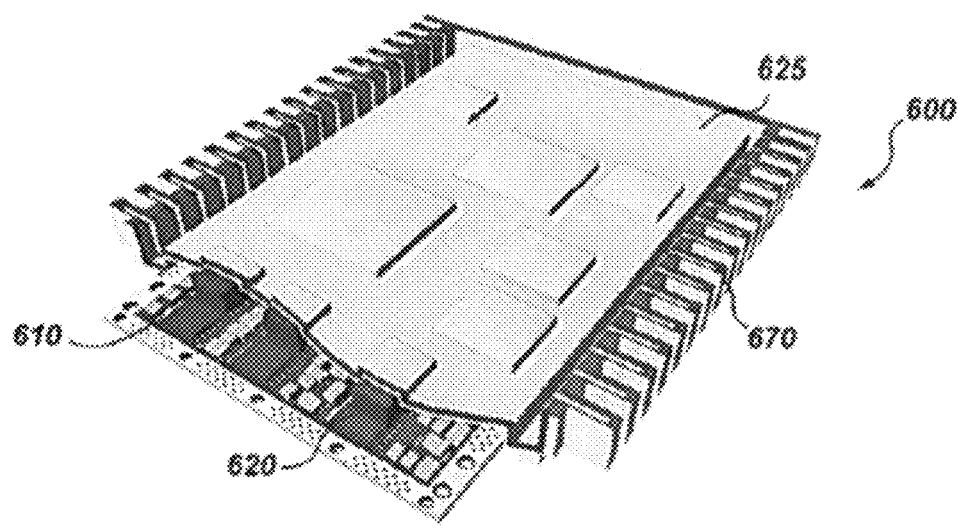
FIGS. 6A and 6B depict the modular vapor chamber according to one embodiment.
Figure 6B:
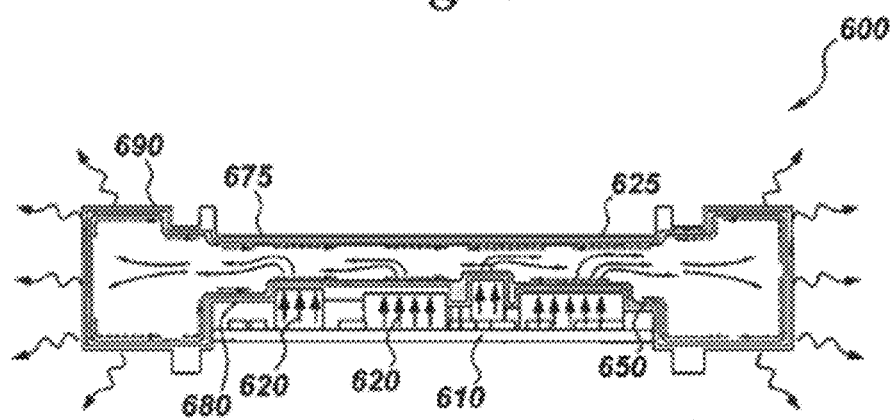

In FIGS. 6A and 6B, embodiments of the present system as a modular vapor system 600 are illustrated. The depiction in FIG. 6A shows a modular vapor chamber 600 that is custom designed to the circuit card 610 and having heat fins 670 to dissipate heat from the electronic components 620. The electronic components 620 reside on at least one surface of a circuit card 610 that engages the heatframe 625. The heatframe 625 in this example is designed to conform to the electronic components 620 to be in close proximity to the components 620 in order to efficiently remove heat from the components 620. The heatframe 625 is configured so the interior component side of the heatframe 625 is sized and shaped about the components 620 for optimal thermal transfer. In one example the circuit card 610 has components 620 on both sides and the heatframe 625 on both sides.

Referring to FIG. 6B, a three-dimensional (3D) vapor channel chamber 600 for a circuit card 610 is depicted in a cut away side perspective view. The modular vapor chamber 600 has a component side 680 that in this example is custom designed to conform to the heat generating components 620 and optimize heat transfer by being in close proximity to the components. In one example the component side 680 is configured to conduct heat from at least one surface of the components 620, in particular those that generate the most heat. In another example, the component side 680 is configured to conduct heat from more than one surface of the components 620 such as the component top surface and one or more side surfaces. In one embodiment, coupled to the component side 680 is a 3D wick structure 650 that helps to direct liquid towards the heated components 620 such as from the receptacle 690 located near the sides. The liquid is converted to vapor by the heated components 620, wherein the vapor absorbs the heat and moves outwards towards the receptacles 690 where the vapor is converted back into liquid. The receptacles 690 provide for further heat transfer such that heat from the vapor is removed and turns into liquid.

In one example the modular vapor assembly 600 is integrally formed with the 3D wick structure 650, the component side 680 and the upper side 675 with the vapor chamber formed there between and having receptacles 690 on both sides. The distance between the component side 680 and the opposing upper side 675 of the heatframe 625 is typically at least 0.5 mm and can be further optimized for the required heat transfer to allow for the liquid to move along the wick surface from the receptacles 690 and for the vapor to return to the receptacles 690. In this example there are no internal supports. The integral structure includes the mounting features to mate with the circuit card 610.

Figure 7:
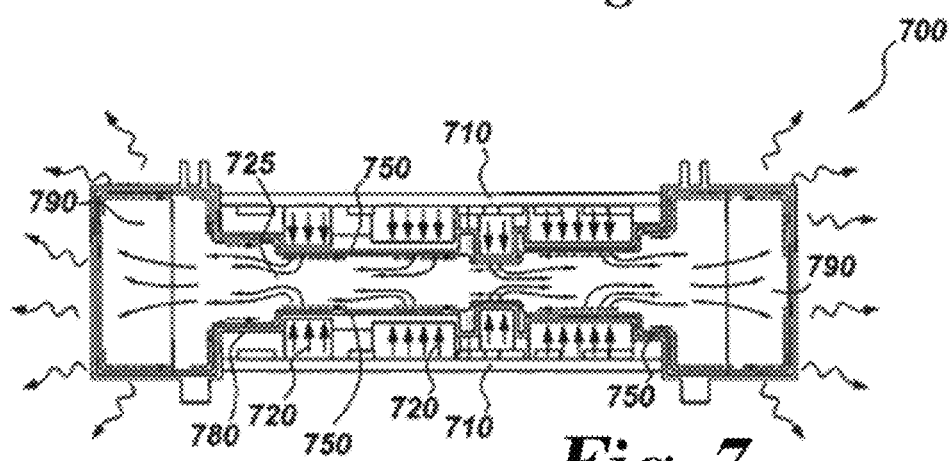
FIG. 7 shows another embodiment of the modular vapor chamber with two circuit cards.

Referring to FIG. 7, a cut away side view perspective shows one embodiment of the present system 700 that includes an integral three-dimensional (3D) vapor chamber assembly 725 disposed between two circuit cards 710. The two circuit cards 710 each include a number of components 720, wherein the cards can be identical cards having the same components or different components and layout. The vapor chamber assembly 725 includes two component side surfaces 780 with 3D wick structures 750 that form a vapor channel there between. In one example the modular vapor assembly 725 is integrally formed with the 3D wick structure 750 and the vapor chamber 725 formed between the two circuit cards 710 have receptacles 790 on both sides. In this example there are no internal supports. Further, the integral structure includes the mounting features to mate with the circuit cards 710.

Figure 8:
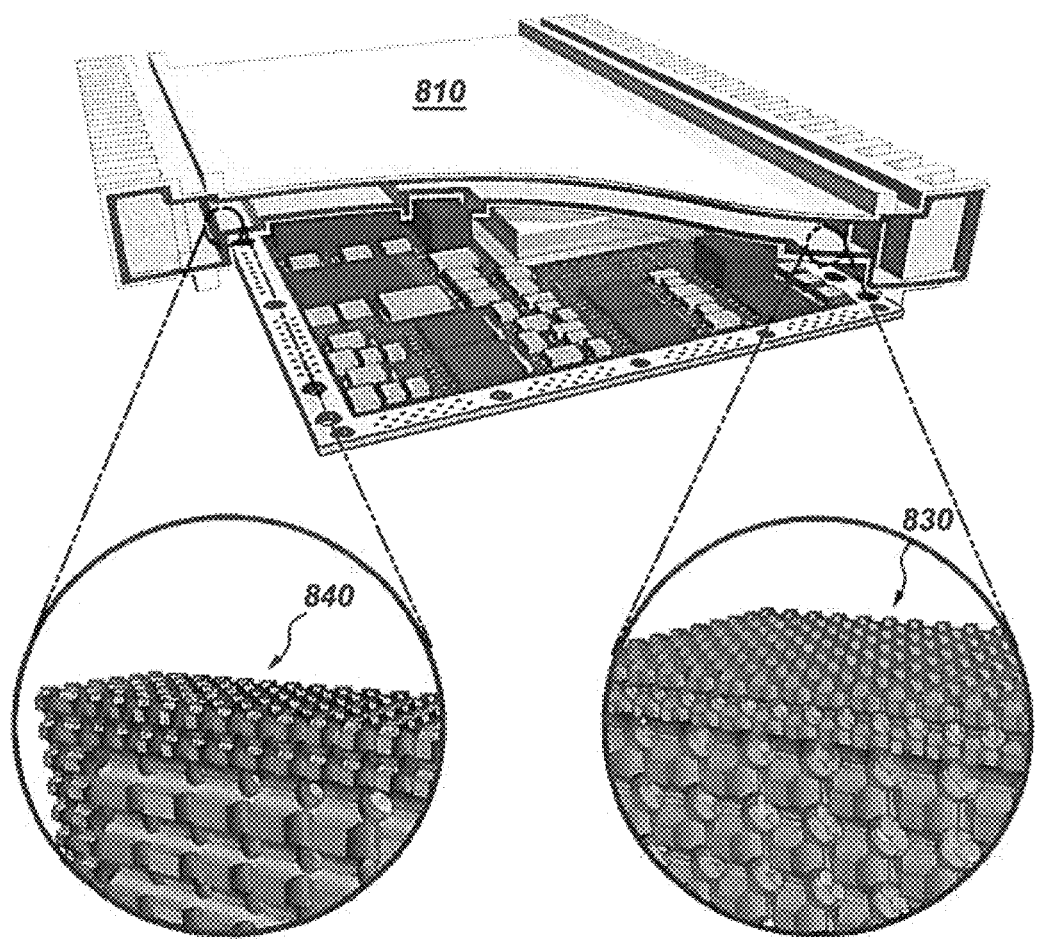
FIG. 8 is another example of the modular vapor chamber and various non-uniform 3D wick structures.

FIG. 8 is an example of a thin modular vapor chamber 810 with various non-uniform 3D wick structures. In FIG. 8 the vapor chamber assembly in this embodiment illustrates a thin vapor chamber 810 with the 3D wick structures 830 and/or 840 formed on the component side of the vapor chamber. In one example the wick is a non-uniform wick in a thickness direction 830. In a further example the wick is a non-uniform wick in the thickness and planar directions 840. As used herein, the "thickness" refers to dimensions normal to local vapor chamber casing and "planar" refers to dimensions parallel to local vapor chamber casing.

Figure 9A:
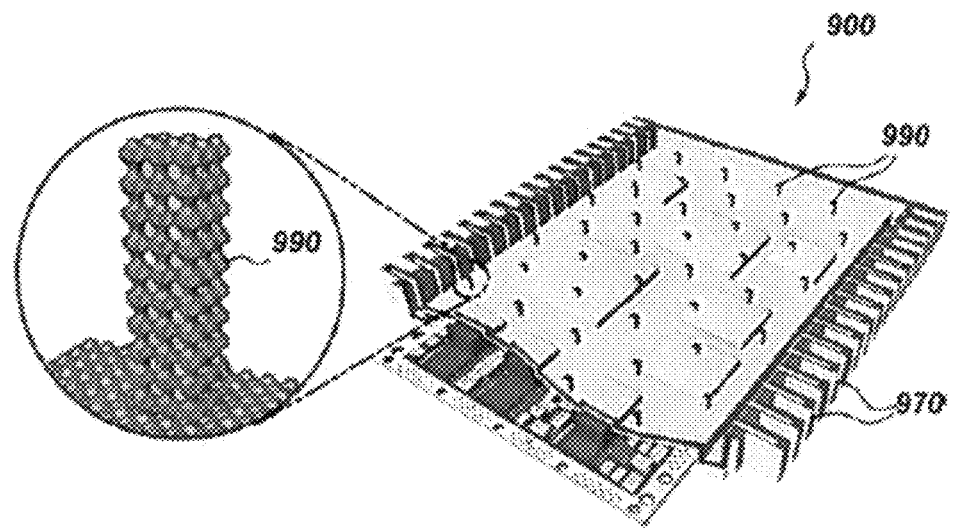
FIG. 9A shows another example of the modular vapor chamber having internal supports in accordance with another embodiment.
Figure 9B:
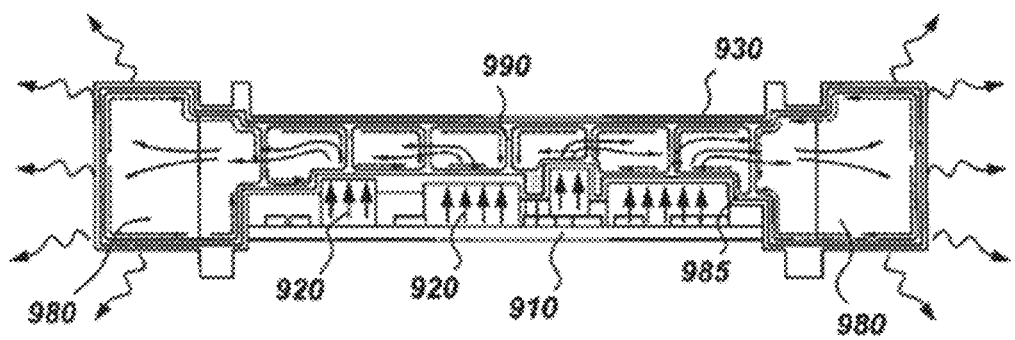
FIG. 9B shows a modular vapor chamber embodiment with 3D wick structures for enhanced support and fluid flow.

FIG. 9A shows another example of the modular vapor chamber having internal supports. FIG. 9B shows the modular vapor chamber embodiment with off-plane 3D wick structures for enhanced support and fluid flow. Referring to FIGS. 9A and 9B, the modular vapor assembly 900 is depicted showing internal supports or posts 990 that can be used to enhance stiffness and increase the liquid return. In this example, the modular vapor assembly 900 includes the modular vapor chamber 930 with one or more posts 990 that add greater stiffness to the assembly. A further aspect of the supports 990 is to increase the liquid transport by means or capillary action. The circuit card 910 includes electronic components 920 that generate heat that is conveyed to the vapor chamber 930 due to the close proximity to at least one side of the vapor chamber 930. The heat from the component 920 converts the liquid in the vapor chamber 930 to vapor that is then conveyed to the receptacles 980 and converted to liquid. The liquid is transported by the 3D wick structure 985 that is formed on the component side of the vapor chamber 930. The posts 990 in this example are integrally formed 3D wick structures that provide further capability to transport the liquid.

Figure 9C:
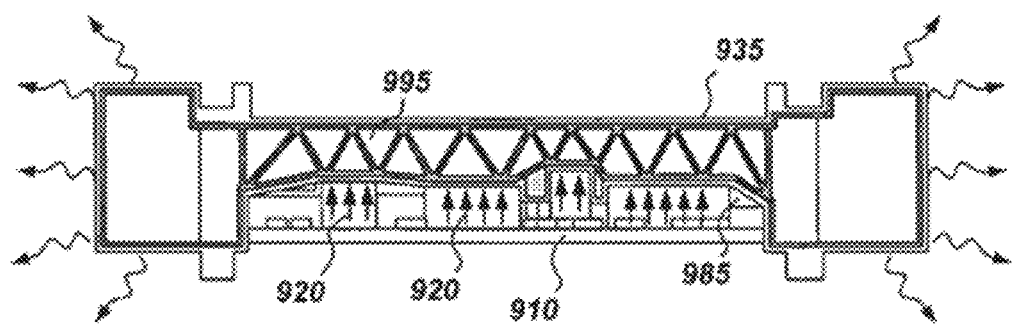
FIG. 9C shows a modular vapor chamber embodiment with internal support structures that may also serve as feeder arteries for the liquid.

FIG. 9C shows another embodiment of the modular vapor chamber embodiment 935 with internal support structures 995 that may also serve as feeder arteries for the working liquid. The components 920 generate heat that is transferred to the vapor chamber 935 which causes evaporation of the liquid in the 3D wick structures 985 and converts the liquid to vapor that travels above the 3D wick structures 985 to the receptacles. The internal support structures 995 in one example resemble bridge trusses or other bio-inspired structures for the vapor chamber case for high strength and low weight. Typically, the thickness of the vapor chamber case is 100-150 microns. However, using support structures such as 995, the vapor chamber case and the wick features can be made thinner, especially in proximity of the hot components and enhanced fins to decrease the thermal resistance. The 3D wick structure and the internal support structures in one example are integrally formed by 3D printing or other additive manufacturing processes. In another embodiment of the invention, the 3D wick structure and the 3D internal support structures are formed independently of the 3D vapor chambers by precision sintering builds of metallic powders deposited on the vapor chambers, as is described in details below.

Figure 10A:
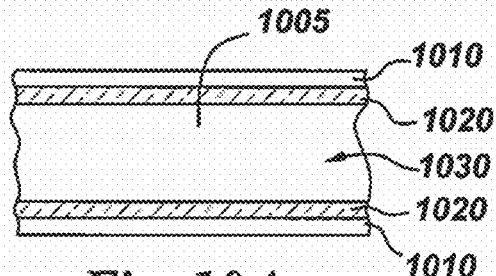
FIGS. 10A-10G depicts various embodiments of the structural characteristics for the internal supports for the 3D vapor chamber.

FIGS. 10A-10G depicts various embodiments and structural characteristics for the internal supports for the 3D vapor chambers described herein. The internal supports are used, for example, to maintain the shape of the vapor chamber and the dimensions for the vapor and liquid transport. While certain embodiments shown herein depict the vapor chamber having a 3D wick structure on only one side of the vapor chamber, FIG. 10A shows the vapor chamber 1005 has two component sides 1010 and two porous wick portions 1020 that are on opposing sides and with a vapor space 1030 there between. Such an embodiment would be used when there are circuit cards with components (not shown) coupled on either side and conductively coupled to the vapor chamber component sides 1010 and with the vapor space 1030 disposed there between.

The vapor chamber in a further embodiment includes internal supports that are fabricated via the 3D printing process in numerous designs, number, shapes and sizes such as shown in FIGS. 10B-10G. In one example, the supports include one or more solid internal support structures with braces 1045 that can be perpendicular within the vapor chamber case or angled. Another example includes having solid internal support structures 1055 that are curved or have a curved portion. In other embodiments, the internal supports 1065, 1075 include liquid feeder arteries to facilitate the liquid transport. For example, the internal supports can be porous structures that can be straight 1065 or curved 1075. Operationally, the supports should be designed such that the vapor chambers can withstand atmospheric pressure at any point of time. Specifically, the vapor chambers should neither break down under high atmospheric pressure nor implode under low atmospheric pressure. Further, the supports should be designed such that the vapor chambers do not affect the overall desired stiffness or rigidity of the chassis assembly.

Figure 10B:
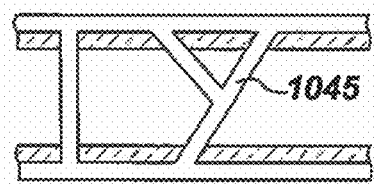
Figure 10C:
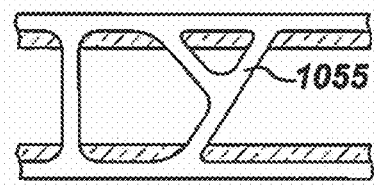
Figure 10D:
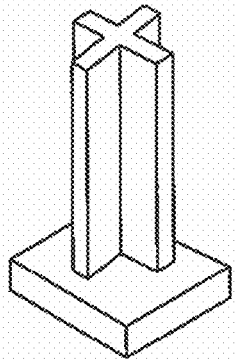

Various shapes for solid internal supports are shown in FIGS. 10B-10D. Referring to FIG. 10B, the internal support and brace 1045 are straight structures that are internally coupled between the opposite surfaces of the vapor chamber 1040. In FIG. 10C, the solid internal support structures are angled or curved 1055. FIG. 10D shows an internal support structure 1050 without the brace. The internal support in one example is positioned proximate the heated component(s), sometimes referred to as the pocket. In another example shown in FIG. 10 E, the solid internal support structure includes a vascular or root system for efficient spreading of force/loads and/or liquid.

Figure 10F:
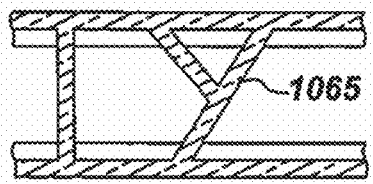
Figure 10G:
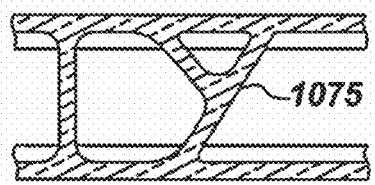
Figure 10E:
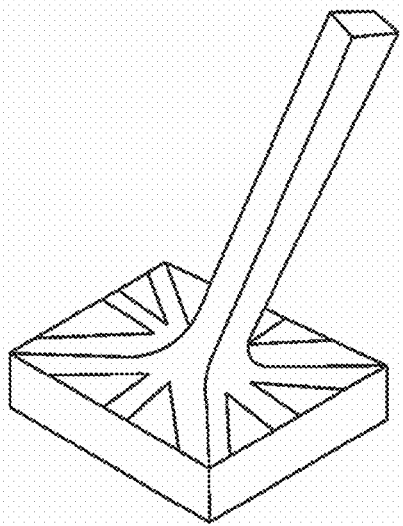

FIGS. 10F and 10G depict internal support and liquid feeder arteries. The support structures in these examples are porous and allow for liquid and/or air to pass through the structure within the vapor chamber. FIG. 10F shows straight porous internal support structures while FIG. 10G illustrates angled or curved internal support structures.

The number of the internal supports may be dependent upon the design criteria and factors include the required support for the vapor chamber case and the thermal properties of the various supports. The size and shape for the internal supports also depends upon the design criteria and thermal/mechanical requirements. Whenever the supports are desired only for lending structural strength to the vapor chamber, solid supports are used. On the other hand, when the supports are desired additionally for enhanced cooling of the electronic components, 3D wick structure is used.

Further, what is needed to enhance processing power and functionality is to improve the thermal performance of the heat transfer mechanism. One other aspect of more efficient thermal management is to ensure more efficient transfer of heat-carrying fluid through the 3D wick structure.

According to one embodiment, there are various 3D wick structures that are employed with the vapor chamber assemblies. In one example the 3D wick structures are integrally formed on the 3D vapor chambers by means of an additive manufacturing processes such as 3D printing. The 3D wick structures can be uniform or it can include non-uniform 3D structures growing in multiple directions. According to one embodiment of the invention, the 3D wick structures are deployed within the internal space of the vapor chamber and also serve as internal support structures in at least some of the instances.

In another embodiment of the invention, the 3D wick structure (FIG. 6B, 650; FIG. 7, 750; FIG. 8, 830, 840; and FIG. 9B, 985) is independently created by precision sintering metal build powder particles deposited on at least some of the interior of the closed 3D vapor chamber. Such precision sintered 3D wick structure transports the working fluid by capillary action from at least one working fluid receptacle (FIG. 6B, 690; FIG. 7, 790; FIG. 9B, 980) to the at least a part of the heated portion of the electronics. Typically, the working fluid absorbs heat from the fluid heated portion of the electronics and changes its phase from liquid to gaseous or vapor state. The heat absorbed in the working fluid is subsequently dissipated in the working fluid receptacle where the heat is removed, accompanied by phase change from gaseous or vapor state to liquid state. In a manner like the integrally formed 3D wick structures, the precision sintered 3D wick structures can be uniform or it can be non-uniform 3D wick structures, growing in multiple directions. According to yet another embodiment, the precision sintered 3D wick structures are deployed within the internal space of the vapor chamber and also serve as internal support structures. The support structures mainly support the 3D closed vapor chamber envelope from collapsing during operation and additionally facilitate transfer of liquids and gas through their internal 3D porous zones, as is illustrated in more details below.

Figure 22:
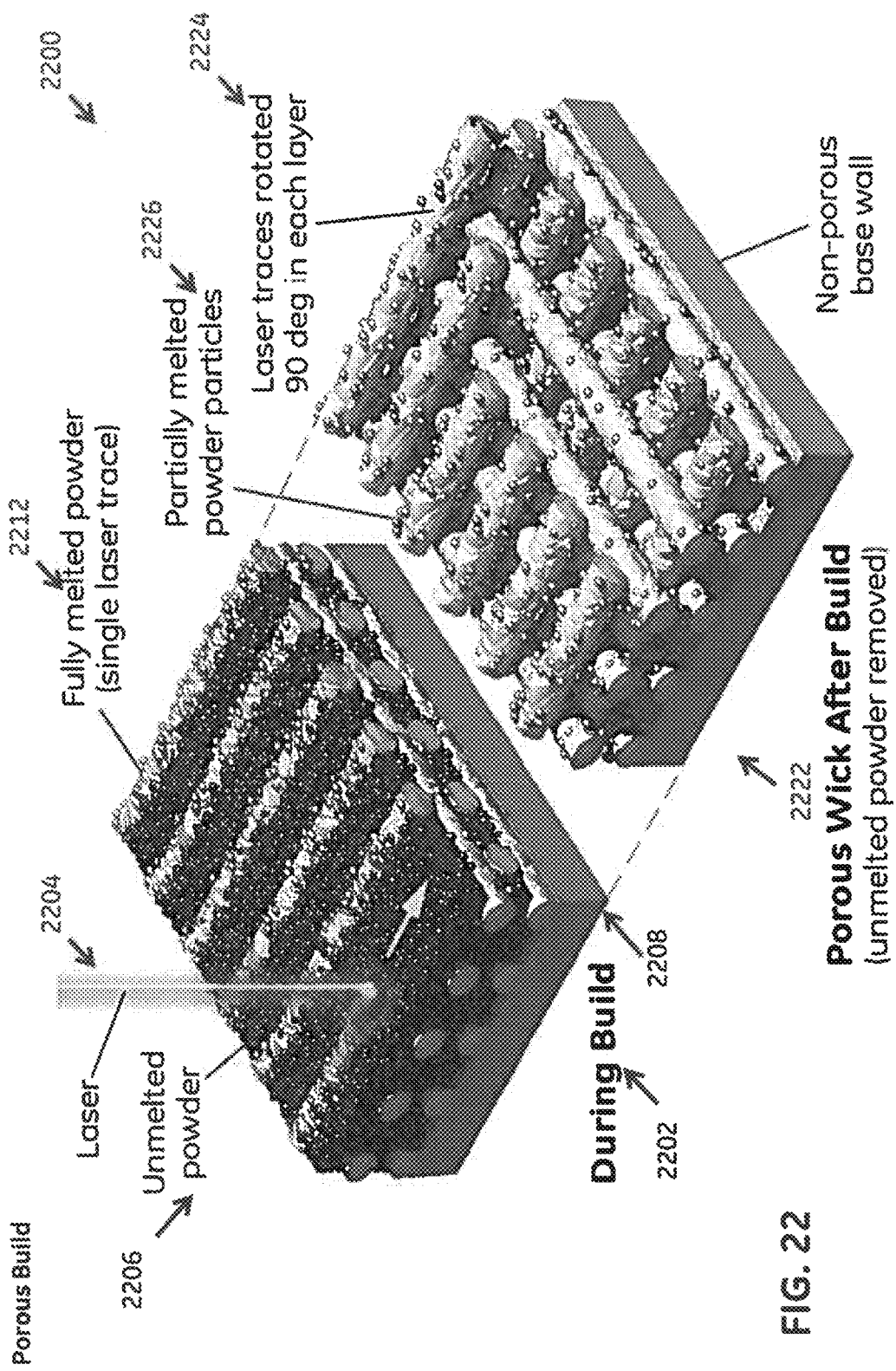
FIG. 22 illustrates a perspective view of an operational assembly process of an exemplary 3D wick structure that includes two stages of building, in accordance with one embodiment of the present invention.

FIGS. 22-29 illustrate several typical exemplary arrangements of the components and operational sequences of deploying a 3D wick structure or 3D internal support system. Referring to FIG. 22 first, operational assembly 2200 illustrates two stages of the building process of a typical 3D wick structure, during-build stage 2202 and post-build stage 2222 employing several non-limiting components. Beginning with loose metal build powders, during the build stage 2202, laser power 2204 is initially applied in a single laser trace on an unmelted pool 2206 of metallic powder. With continued application of the laser power, a mixed mass of partially fused or melted and fully fused or melted powder pool 2212 results. The base wall 2208 is one instance where all the metal build powders are completely fused or melted forming a solid base. Subsequently, during the post-build stage 2222, laser traces are rotated by a predetermined angle (e.g. 90 degrees or 60 degrees, as exemplary non-limiting examples) in each layer, as indicated by numeral 2224 and laser power is further applied on powder particles 2226 that are still partially melted. Further details of the laser traces and the metal powder melting process are captured in schematic diagrams FIGS. 23-25, as described below. As elaborated below, the process and laser passes continue in iteration until a satisfactory part of the intended 3D porous zones 2902 (FIG. 29) and 3D nonporous zones 2904 (FIG. 29) are built.

FIG. 23 schematically illustrates the top view of a collection 2300 of metal build powder particles 2302. FIG. 24 schematically illustrates the side view 2400 of the collection 2300 of metal build powder particles 2302, arranged in two or more non-limiting number of exemplary layers, represented by 2402 and 2404. Further, FIG. 25 schematically illustrates a top view 2500 of the same collection 2300 of metal build powder particles 2302, as arranged in two or more non-limiting number of exemplary layers, represented by 2402 and 2404.

Referring now to FIGS. 26-29, non-limiting exemplary steps of building a precision sintered 3D wick structure and several technical components are described in details. FIG. 26 schematically illustrates the top view of a first laser pass process 2600 applied to build a precision sintered 3D wick structure that includes a number of non-limiting layers 2602 of metal build powder particles 2302. Out of all the particles 2302, a first collection of metal build powder particles 2604 from a first group of layers is sintered to create a three dimensional (3D) porous zone (FIG. 29, 2902). Specifically, the first collection of metal build powder particles 2604 is sintered by applying a first predetermined laser spot input power 2608 corresponding to a first combination of laser parameters. There remains a collection 2606 of metal powder particles that are not sintered yet. The first combination of laser parameters includes predetermined ranges of one or more of: input power value, laser spot size, laser velocity, hatch spacing, build layer thickness, build powder particle size, and build powder distribution. In one non-limiting and exemplary embodiment of the invention, the respective ranges for the input power value is from 30 W to 5 KW, laser spot size is from 30 microns to 1000 microns, laser velocity is from 0 to 2 m/s, hatch spacing is from 20 microns to 1000 microns, build layer thickness is from 5 microns to 250 microns, build powder particle size is from 10 microns to 250 microns. In one further embodiment of the invention, several non-limiting and exemplary distributions of the build powder may be Gaussian or Bi-modal or Multi-modal. The process 2600 and laser passes 2608 may continue in iteration until a satisfactory part of the intended 3D porous zones (FIG. 29: 2902) are built.

In a similar manner, FIG. 27 schematically illustrates the top view of a second laser pass process 2700 applied to build a precision sintered 3D wick structure that includes a number of non-limiting layers 2702 of metal build powder particles 2302. Out of all the particles 2302, a second collection of metal build powder particles 2704 from each of a second group of layers 2702 from the number of layers present is then melted to create a 3D nonporous zone (FIG. 29, 2904). Specifically, the second collection of metal build powder particles 2704 is melted by applying a second predetermined laser spot input power 2708 corresponding to a second combination of laser parameters. There remains a collection 2706 of metal powder particles that are not sintered yet. The second combination of laser parameters includes predetermined ranges of one or more of: input power value, laser spot size, laser velocity, hatch spacing, build layer thickness, build powder particle size, and build powder distribution. In one non-limiting and exemplary embodiment of the invention, the respective ranges for the input power value is from 30 W to 5 KW, laser spot size is from 30 microns to 1000 microns, laser velocity is from 0 to 2 m/s, hatch spacing is from 20 microns to 1000 microns, build layer thickness is from 5 microns to 250 microns, build powder particle size is from 10 microns to 250 microns. In one further embodiment of the invention, several non-limiting and exemplary distributions of the build powder may be Gaussian or Bi-modal or Multi-modal. The process 2700 and laser passes 2708 may continue in iteration until a satisfactory part of the intended 3D nonporous zones (FIG. 29: 2902) are built.

In a similar manner, FIG. 28 schematically illustrates an alternate process 2800 that includes non-limiting and only exemplary sequences of first laser passes 2802 and second laser passes 2804 applied in crisscross manner, to build a precision sintered 3D wick structure that includes a number of non-limiting layers 2602 of metal build powder particles 2302. Out of all the particles 2302, a first collection of metal build powder particles 2604 from of a first group of layers is sintered to create a 3D porous zone (FIG. 29, 2902) and a second collection of metal build powder particles 2704 from each of a second group of layers 2702 from the number of layers present is then melted to create a 3D nonporous zone (FIG. 29, 2904). Specifically, the first collection of metal build powder particles 2604 is sintered by applying a first predetermined laser spot input power 2608 corresponding to a first combination of laser parameters and the second collection of metal build powder particles 2704 is melted by applying a second predetermined laser spot input power 2708 corresponding to a second combination of laser parameters. There remains a collection of metal powder particles 2606 and 2706 that are not sintered. Both the first combination of laser parameters as well as the second combination of laser parameters include predetermined ranges of one or more of: input power value, laser spot size, laser velocity, hatch spacing, build layer thickness, build powder particle size, and build powder distribution. In one non-limiting and exemplary embodiment of the invention, the respective ranges for the input power value is from 30 W to 5 KW, laser spot size is from 30 microns to 1000 microns, laser velocity is from 0 to 2 m/s, hatch spacing is from 20 microns to 1000 microns, build layer thickness is from 5 microns to 250 microns, build powder particle size is from 10 microns to 250 microns. In one further embodiment of the invention, several non-limiting and exemplary distributions of the build powder may be Gaussian or Bi-modal or Multi-modal. The process 2800 and laser passes 2802 and 2804 may continue in iteration until a satisfactory part of the intended 3D porous zones 2902 and 3D nonporous zones 2904 are built.

Referring to FIG. 29, precision sintered structure 2900 schematically illustrates in a non-limiting and only exemplary manner, a top view of the cross-section of the 3D wicks as an outcome of any one or more of the laser pass processes 2600, 2700 and 2800 run on the several layers of metal build powder particles described in FIGS. 22-29. As is evident, the 3D wick structure includes intended 3D porous zones 2902 and 3D nonporous zones 2904.

In one exemplary embodiment of the invention, the system of thermal management additionally includes one or more precision sintered 3D internal support structures within the vapor chamber, built in a manner similar to the precision sintered method of building the 3D wick structure. The precision sintered 3D internal support structure supports the vapor chamber structurally from within. Further, any one or more of the precision sintered 3D wick structures and the precision sintered 3D internal support structures may be non-uniform and at least part of at least one of: a case of the vapor chamber and the 3D wick structures may be compliant.

Referring to FIG. 30, four exemplary (20×20×0.3) mm cross-sections of porous 3D wick structures made out of Titanium (Ti64) build powder, as contained in plate 3000 were created by sintering the build powder particles layers with lower laser spot input powers of 40-100 W. Two magnified views 3002 and 3004 are presented as representation of the non-limiting and only exemplary structural details. The critical input power required to make a fully formed sintered 3D wick structure is typically between 60 W and 80 W.

Referring to FIG. 31, photographic plate 3100 represents comparison of cross-sections for two (12×12×2) mm samples 3102 and 3104 with interior surfaces lined with 250 microns thick, sintered build powder wicks. The solid walls are 250 microns thick and the porous 3D wick structure is made with the DMLM laser power and speed set at, respectively, 110 W and 2000 mm/s. The laser pass spacing parameter for the 3D wick structure is typically set to a) 160 microns or b) 200 microns. Dark squares in the right-most figures show pockets in the 3D wick structure to collect excess build powder at the base of the fill tubes.

Referring now to a set of non-limiting and only exemplary specifics of the laser parameters, as embodied in FIG. 32, the table 3200 represents comparison of the DMLM laser parameter settings for conventional solid wall vis-à-vis 3D wick-porous structures described herein. The energy per unit length input into the Ti64 build powder is 0.14 J/mm for solid walls and was varied between 0.05-0.07 J/mm for porous 3D wick structure.

Referring to the non-limiting and only exemplary specifics of the metal build powder particles and laser parameters, the metal build powder particles typically have diameters between 10 microns and 50 microns. The smallest feature size achievable with current commercial Direct Metal Laser Sintering (DMLS) systems and Ti64 build powder is 150-200 microns. More specialized DMLS systems in which the operator has more control of the system parameters, can achieve only slightly smaller feature sizes (~100 microns) in similar, low thermal conductivity metal powders such as cobalt chrome and inconel. It is to be noted that conventional sintered copper particle wicks in high performance heat pipes have average particle diameters of ~60 microns, pore sizes of ~40 microns and porosities of ~0.45. While the spacing between the DMLS feature sizes may be made smaller to produce 40 microns pore sizes, the effective porosity of the resulting 3D wick structure (the volume fraction of open pores) is typically small (0.13 for a regular rectangular 3D wick structure composed of 200 microns beams with 40 microns spacing). Given the vastly larger data file sizes required to store the even smaller pore-scale CAD geometry required as input for commercial DMLS systems, current approach as described above, creates higher performance 3D closed vapor chamber wicks characterized by smaller pores and larger porosity.

Referring to FIG. 33, plot 3300 represents comparison of measured thermal resistance, measured in C/W, as represented in y-axis 3302 vs. heat input measured in W, as represented in x-axis 3304. Lines 3312, 3314 and 3316 respectively represent characteristic curves for: (100×12×2) mm sample solid aluminum (Al), sample 1.5, 35 C, 0 g and sample 1.5, 35 C, 0 g. The 300 microns thick sintered build powder wick lined only the bottom surface of sample 1.5.

Referring now to FIG. 34, an operational method 3400 is described in accordance with one embodiment of the invention for thermal management for electronics. The method 3400 includes enveloping the electronics at least partially in at least one 3D closed vapor chamber, as in step 3402. The method 3400 further includes independently creating a precision sintered 3D wick structure on at least some of the interior of the 3D closed vapor chamber, as in step 3404. The method 3400 also includes, transporting a working fluid through the precision sintered 3D wick structure by capillary action as in step 3406 and dissipating heat from the at least a part of the heated portion of the electronics to at least one working fluid receptacle, as in step 3408.

Continuing to refer to FIG. 34, independently creating a precision sintered 3D wick structure on at least some of the interior of the vapor chamber, as in step 3404, includes sintering a first collection of metal build powder particles from each of a first group of layers from the number of layers of metal build powder particles to create a 3D porous zone. Specifically, sintering a first collection of metal build powder particles from each of a first group of layers from the number of layers of metal build powder particles includes sintering by applying a first predetermined laser spot input power corresponding to a first combination of laser parameters. The first combination of laser parameters includes at least one of: input power value, laser spot size, laser velocity, hatch spacing, build layer thickness, build powder particle size, and build powder distribution.

Continuing to refer to FIG. 34, independently creating a precision sintered 3D wick structure on at least some of the interior of the vapor chamber, as in step 3404 also includes melting a second collection of metal build powder particles from each of a second group of layers from the number of layers of metal build powder particles to create a 3D nonporous zone. Specifically, melting a second collection of metal build powder particles from each of a second group of layers from the number of layers of metal build powder particles includes melting by applying a second predetermined laser spot input power corresponding a second combination of laser parameters. The second combination of laser parameters includes at least one of: input power value, laser spot size, laser velocity, hatch spacing, build layer thickness, build powder particle size, and build powder distribution.

Figure 11A:
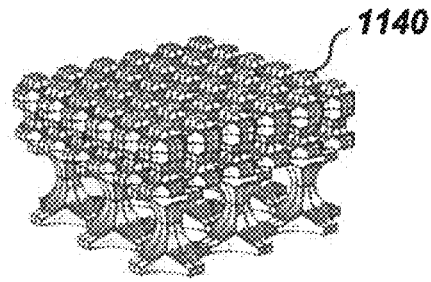
FIGS. 11A-11D depicts several examples of the non-uniform 3D wick structure.
Figure 11B:
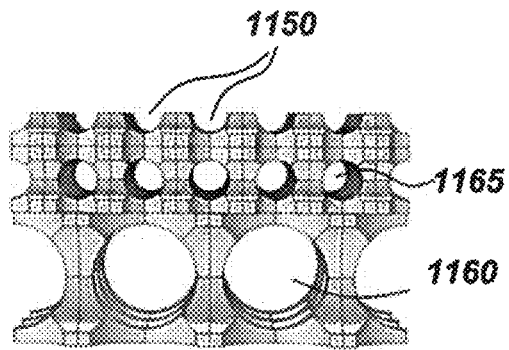

FIGS. 11A-11D depicts several exemplary configurations of the non-uniform 3D wick structure. Specifically, FIG. 11A shows a perspective view of a non-uniform 3D wick structure 1140 in the thickness direction (z direction). In FIG. 11B, the non-uniform 3D wick structure 1150 in the thickness direction shows the pores 1160, 1165 which in this example has larger size pores 1160 proximate the component side of the vapor chamber for transporting liquid. The pores 1165 on the vapor side are of a smaller pore size and transport the vapor to receptacles in the vapor chamber. The pores in these examples are round or curved spaces, wherein the curved 3D wick structure allows for 3D printing in any orientation that allows for non-planar vapor chambers.

Figure 11C:
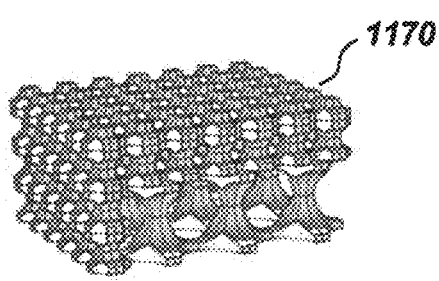
Figure 11D:
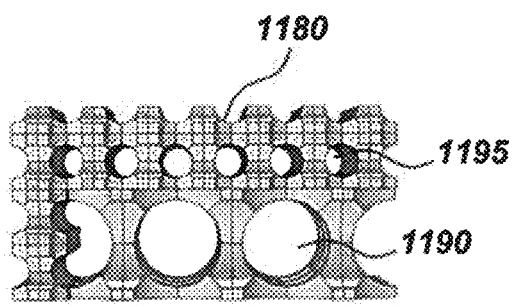

Referring to FIG. 11C, the non-uniform 3D wick structure 1170 is shown in the thickness and in-plane direction (x-y direction). In FIG. 11D the non-uniform 3D wick structure 1180 shows further examples of the larger pores 1190 on the liquid transport side and smaller pores 1195 on the vapor transport side.

The structures shown in FIGS. 11A-11D are one example of a class of geometries by 3D printing in almost any orientation and straightforward transitions from larger to smaller pores and vice-versa. The one example shown is for circular cylindrical "bore-holes" along the three axes. It is to be noted that, apart from the cut planes, there are no straight surfaces in this pore-scale geometry. This attribute is used for build-orientation of independent non-uniform 3D wick structures. The figures show non-uniform 3D wick structures built on a planar surface, but a further embodiment provides for deforming these 3D wick structures to follow a curved 3D surface that in one example has a large radius of curvature relative to the thickness of the 3D wick structure layer. These representative 3D wick structures 1140, 1150, 1170, 1180 that are 3D printed can be built in numerous orientations, unlike posts or braces, because it is built with curves or arc portions. For example, large overhangs cannot be effectively printed without support structures, and these 3D wick structures allow for internal build supports that can be integrated with the inner surfaces, namely the vapor side and the casing side of the vapor chamber.

Figure 12A:
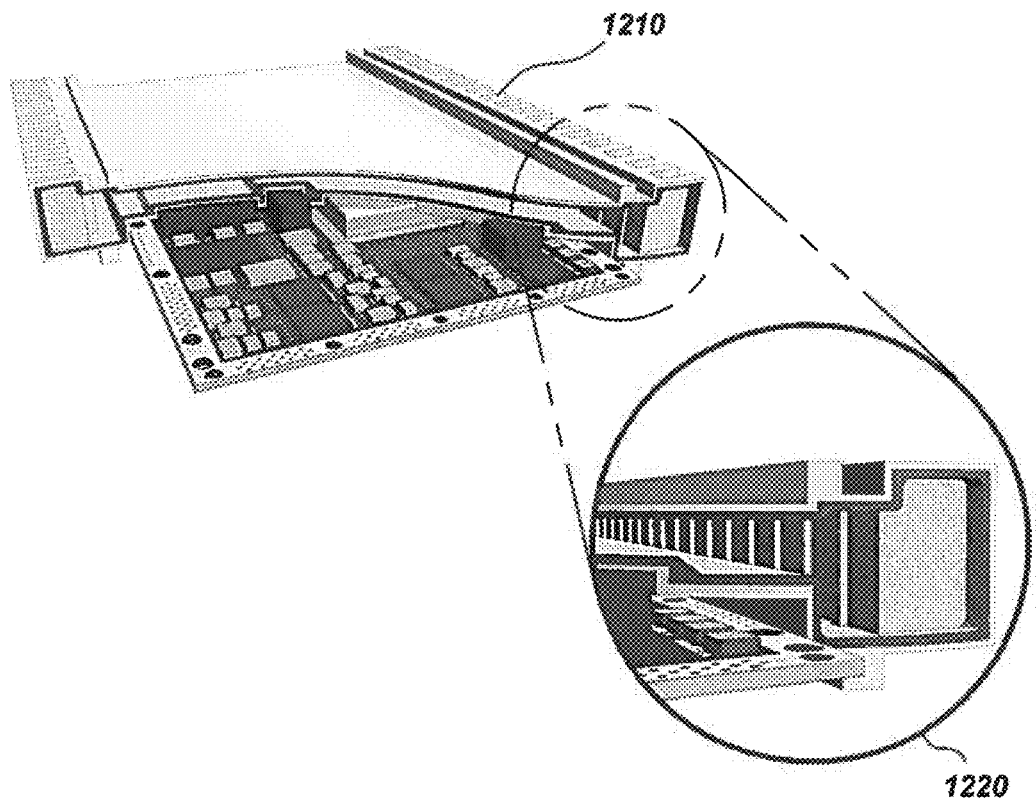
FIGS. 12A-12B show modular vapor chamber embodiments with integrated hollow fins.
Figure 12B:
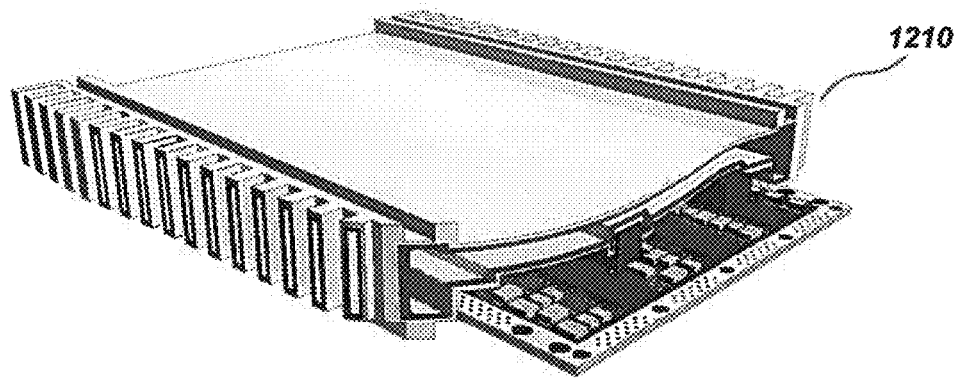

FIGS. 12A-12B show modular vapor chamber embodiments with integrated hollow fins. As shown in FIGS. 12A and 12B, the modular vapor chamber 1210 is shown according to yet another example. In this example, the vapor chamber fins 1220 are hollow vapor chamber fins, thereby permitting a greater surface area for heat transport. The large condenser surface area associated with the fins 1220 dramatically decreases the contribution of the condensation thermal resistance (temperature drop) in the thermal resistance chain. In another embodiment, the hollow fins may be replaced by other heat exchange mechanisms such as an integral fluid heat exchanger or a cold plate interface coupled to the system.

Figure 13:
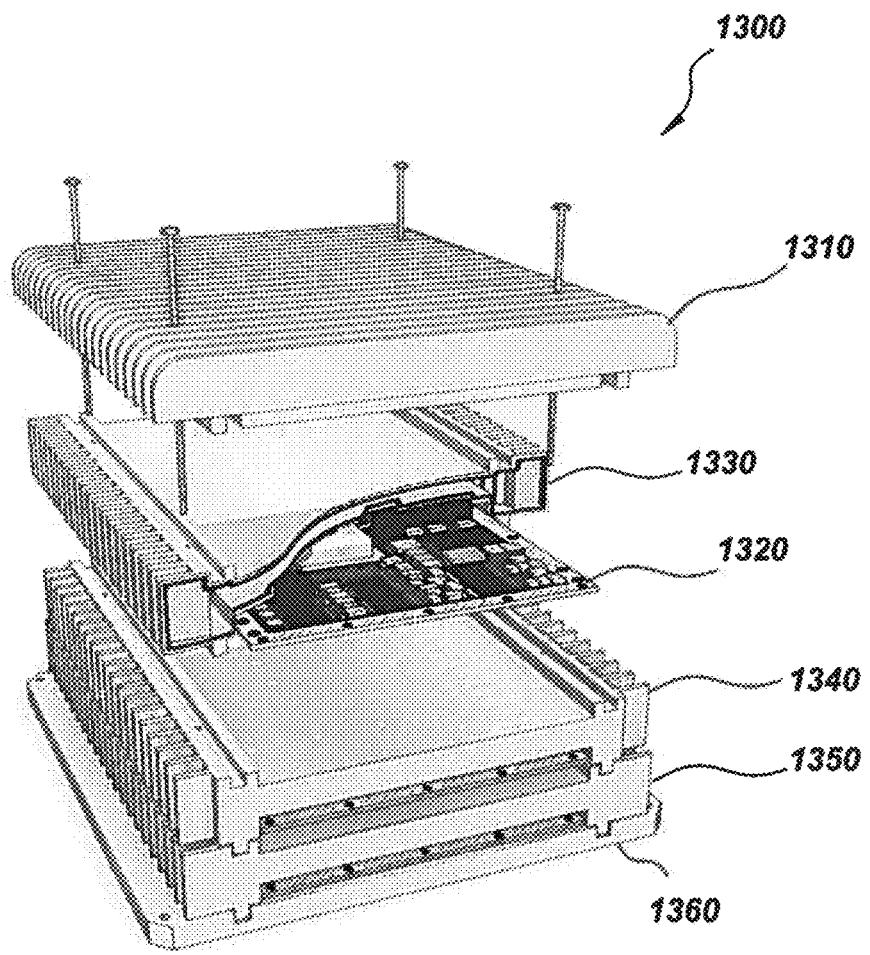
FIG. 13 shows thermal management system as a vertical assembly including several vapor chambers assemblies vertically assembled to form the chassis portion.

FIG. 13 shows a thermal management system for electronics 1300 as a stacked assembly, including several vapor chambers assemblies 1330, 1340, and 1350 with or without circuit cards and assembled along with chassis case portions such as an upper and lower chassis mount to form the chassis 1300. Referring again to FIG. 13, the modular stacked assembly 1300 includes multiple modular vapor chamber assemblies 1310, 1330, 1340, and 1350, each configured to be stacked together to form the larger unit. In one example the circuit card assemblies 1320 are coupled to respective modular vapor chamber assemblies which are then combined into the chassis 1300. As previously described the circuit cards can be coupled to the vapor chamber assemblies such as by friction fit or other securing mechanisms. The modular vapor chamber assembly units 1330, 1340, and 1350 including any corresponding circuit cards 1320 are secured to each other by fastening mechanisms such as bolts. There can be any number of modular vapor chamber assemblies and circuit cards stacked together and secured as a unitary assembly. The outermost portions of the modular stacked assembly may or may not be coupled to circuit cards and may be used for packaging and securing the assemblies and circuit cards.

FIGS. 14A-14D shows an example of forming the stacked modular vapor chambers and corresponding circuit cards assembled into an avionics system 1400 with corresponding input output modules 1410. Referring to FIG. 14A, a further depiction of the stacked modular vapor chambers is illustrated with circuit cards 1440 coupled to both sides of a vapor chamber 1430 forming a vapor chamber sandwich 1450. The sandwich 1450 shows the vapor chamber 1430 disposed between the electronic circuit cards 1440. As shown in FIG. 14B, the modular vapor chamber sandwich 1450 can be stacked with other modular vapor chamber sandwich units and secured to each other to form a modular electronic assembly 1420. In FIG. 14C, the modular electronic assembly 1420 is electrically coupled to a backplane or input/output modules 1410, forming the final assembly 1400 as depicted in FIG. 14D.

As detailed herein, one of the unique attributes of the present system is a 3D vapor chamber having non-uniform 3D wick structures. A further aspect is the collection of individual vapor chambers to form a modular chassis, wherein the circuit cards are aligned and the vapor chambers are stacked to reduce the EMI by isolating the individual vapor chambers.

Referring back to the thermal management system, other features of the modular chassis stack relate to the mechanical architecture. For example, the ability to configure a chassis with a variable number of 'slots' depending on the application, the use of an integral base plate/air mover (such as synthetic jets or fan). A further aspect employs a separable I/O module that is customized to the application and environmental requirements.

Figure 15:
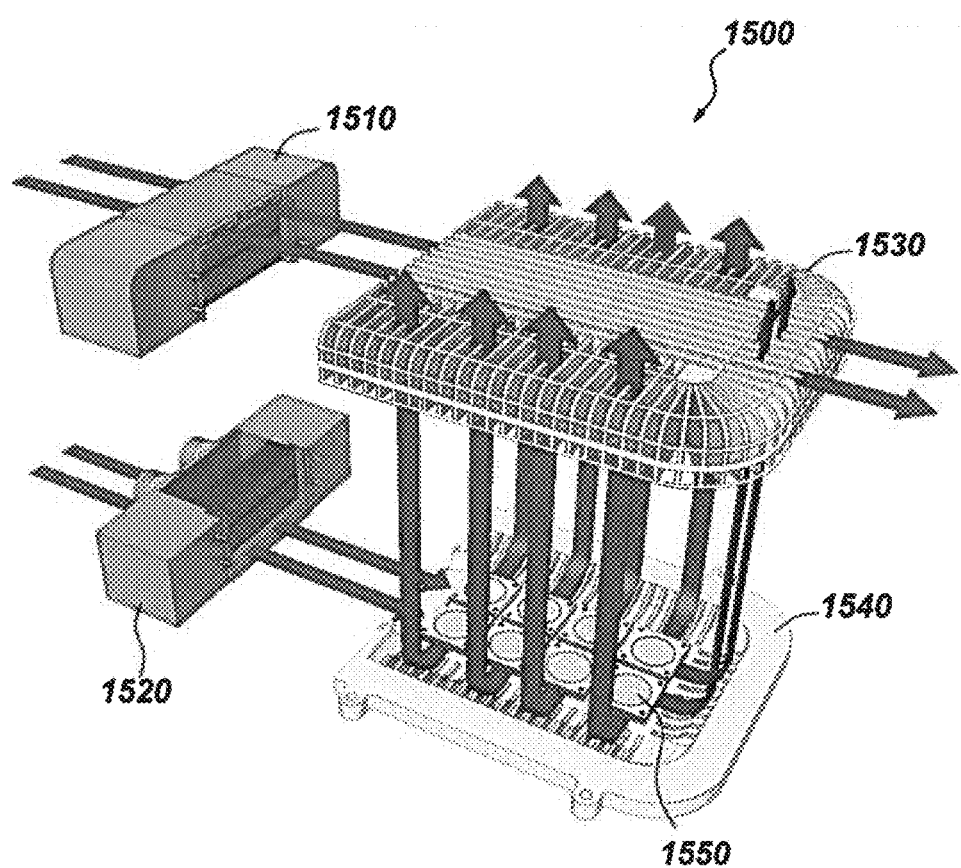
FIG. 15 shows embodiment with enhanced convection using synthetic jets located in bottom tray and on top of I/O module.

For example, FIG. 15 shows an embodiment of the thermal management system for an electronic assembly 1500 with enhanced convection using synthetic jets 1550 located in at least one of the lower tray 1540 and upper tray 1530 of electronic assembly 1500. In this example the upper tray has fins and considerable access to the external environment for increased air flow. The synthetic jets 1550 are added to augment the airflow and enhance free convection. The I/O connectors 1510, 1520 in this example include cut-outs for external air flow such as from turbines or fans.

FIGS. 16A-16C shows a modular vapor chamber 1600 in another embodiment that is integrated into an airframe 1640. Referring to FIG. 16A, the individual vapor chambers 1610, 1620 and 1630 in the shapes and with structural supports for the intended application are shown along with the exterior heat fins. FIG. 16B illustrates the modular vapor chambers assembled into a circular unitary thermal management assembly 1600. FIG. 16C shows the thermal management assembly 1600 configured to enable various applications such as deployment in an unmanned aerial vehicle 1640.

Figure 17A:
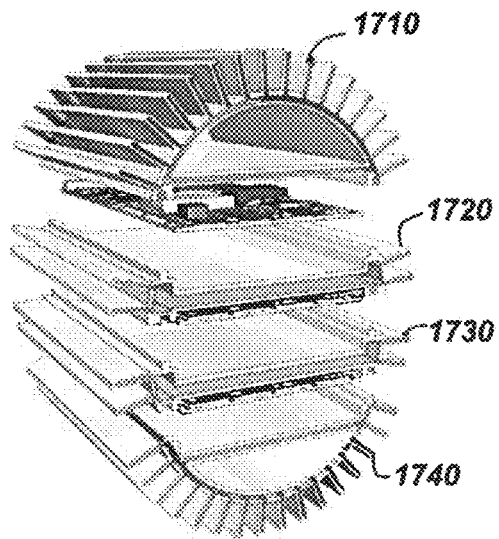
FIGS. 17A-17C shows modular vapor chambers in alternate stacking configurations.
Figure 17B:
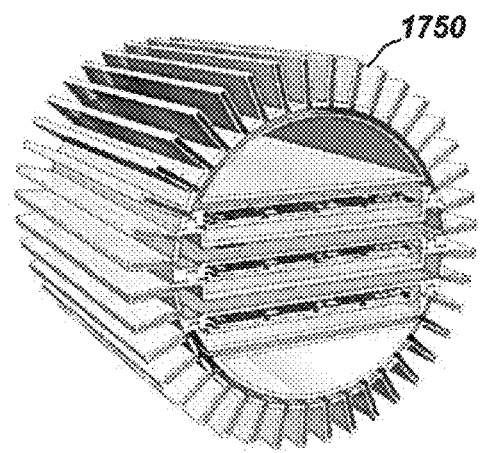
Figure 17C:
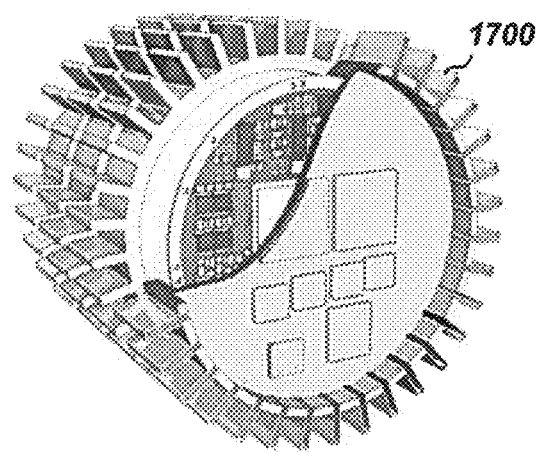

FIGS. 17A-17C shows thermal management assemblies with different stacking configurations of the modular vapor chambers. Referring to FIG. 17A, there are several modular vapor chambers 1710, 1720, 1730 and 1740 with circuit cards coupled to the chambers that are shaped and sized to form the thermal management assembly 1750 of FIG. 17B. The circuit cards for the modular vapor chambers 1720, 1730 are stacked along the length of the thermal management assembly 1750 with exterior fins encircling the assembly 1750 for dissipating the heat. FIG. 17C shows a thermal management assembly 1700 with modular vapor chambers having circuit cards radially disposed in a circular form allowing for heat dissipation on all the exterior surfaces.

Figure 18:
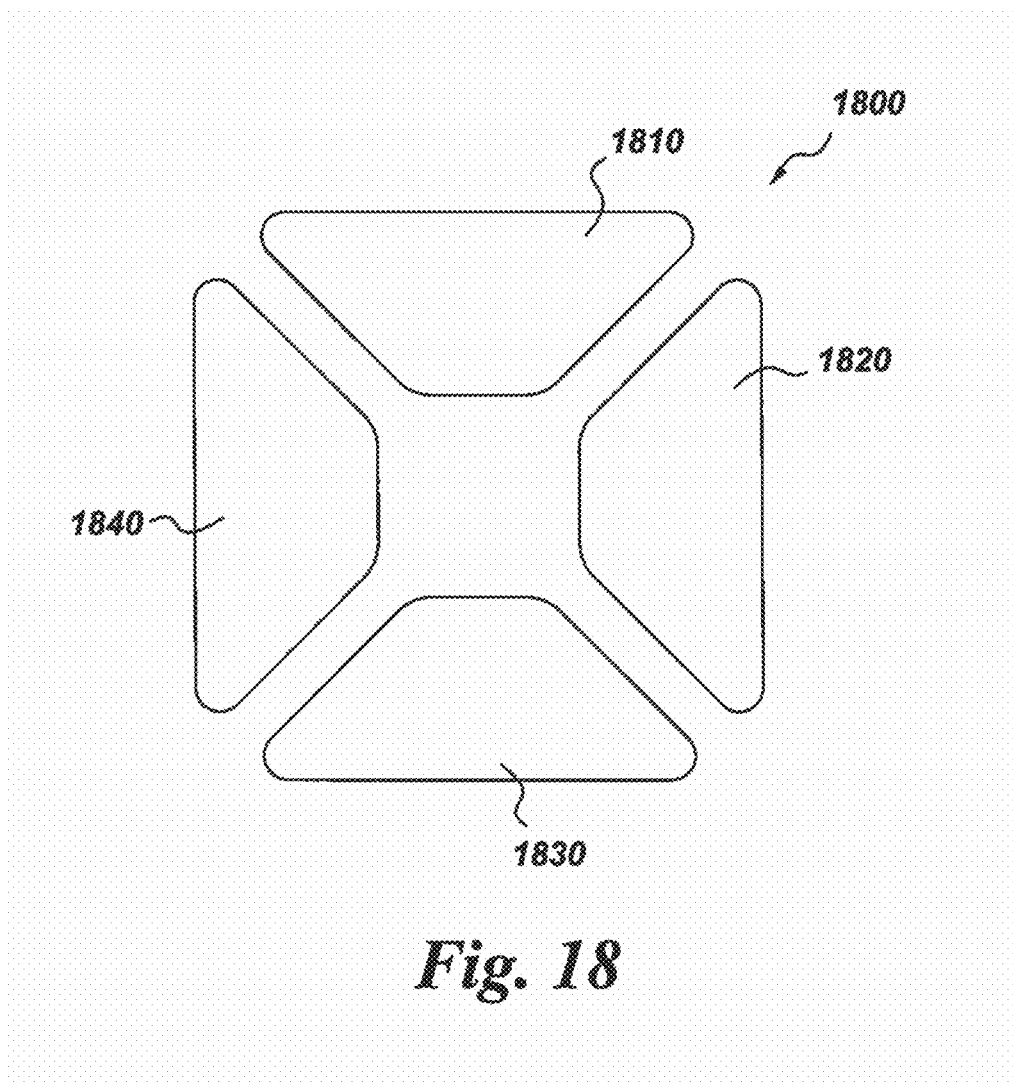
FIG. 18 shows a thermal management system as a planar assembly including two or more of the vapor chambers planarly assembled to form the chassis portion.

FIG. 18 shows a thermal management system 1800 as a planar assembly such as circular, square or rectangular, including two or more partitioned vapor chambers 1810, 1820, 1830 and 1840 planarly assembled to form the chassis of the system 1800. Referring again to FIG. 18, the assembled thermal management system 1800 has a heat-frame that includes a number of partitioned modules/vapor chambers 1810, 1820, 1830 and 1840 from a planar perspective. In one example, a typical heatframe unit is replaced by several vapor chambers 1810, 1820, 1830 and 1840 arranged in a planar manner coupling the vapor chambers with respective circuit cards and assembled to provide thermal and structural support to the thermal management system 1800. In this configuration, even if one of the vapor chambers 1810, 1820, 1830 and 1840 is punctured, the other vapor chambers keep supporting and cooling the electronics. Such a system structure supports redundancy and critical mission initiatives.

Figure 19A:
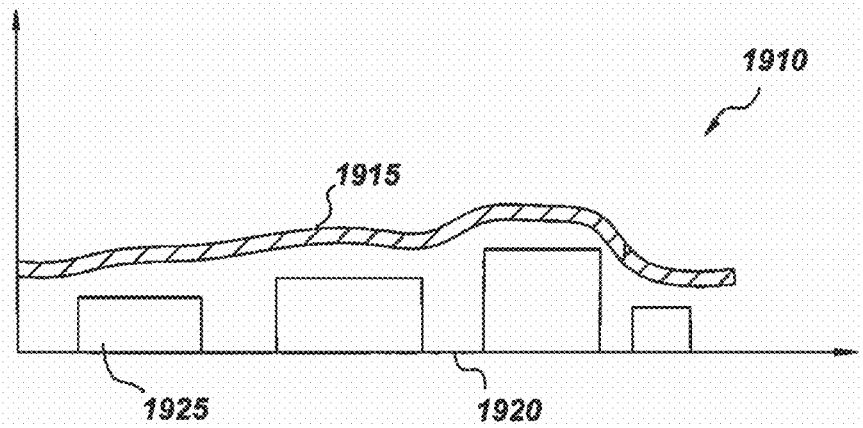
FIGS. 19A-19C shows various surface geometry of the 3D vapor chamber to envelop the circuit electronics including conformal, reverse-conformal and custom-conformal configurations.
Figure 19B:
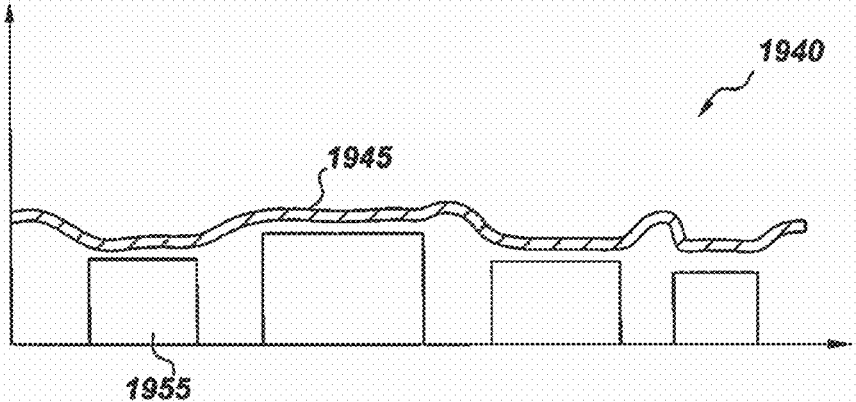
Figure 19C:
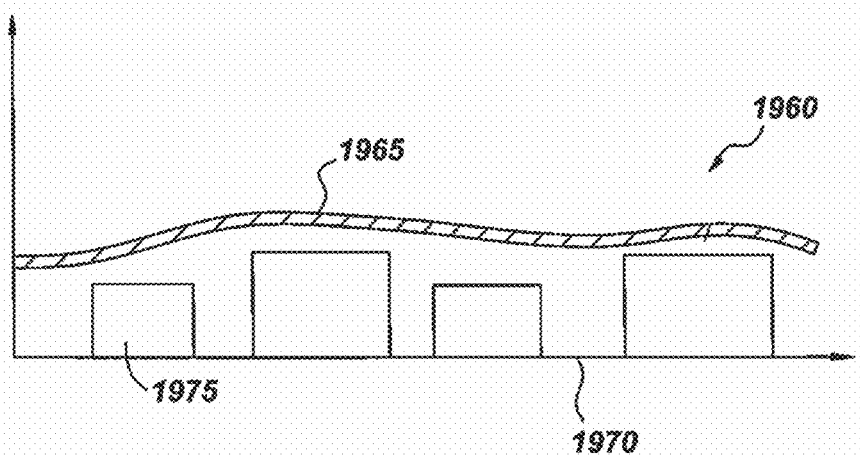

FIGS. 19A-19C shows various surface geometries of the 3D vapor chamber to envelop circuit electronics including conformal, reverse-conformal and custom-conformal configurations. In one example, the distance or gap between the electronic components and the component side of the vapor chamber is 5-12 microns. In FIG. 19A, the thermal management structure 1910 is customized such that the component surface geometry of the 3D vapor chamber 1915 is approximately conformal to the circuit card 1920 and components 1925 in maintaining the vapor chamber in close proximity to the components 1925 for efficient heat transfer. In one example the component side of the vapor chamber provide conductive coupling on the top surface of the components and one or more sides of the components.

In FIG. 19B, the thermal management structure 1940 is customized such that the surface side of the 3D vapor chamber 1945 is reverse-conformal to the circuit card 1950 and components 1955 in keeping with design criteria for integration in the chassis with other cards. In such configurations, the vapor chamber case lifts down and reaches out to the electronic components 1955. This arrangement in certain applications aids in capillary transport of the liquids through the 3D wick structures.

In one further example shown in FIG. 19C, the thermal management structure 1960 is customized such that the surface side of the 3D vapor chamber 1965 is custom-fit to the circuit card 1970 and components 1975 to increase the heat transfer and optimize the cross section coverage of the components 1975 by the vapor chamber 1965 and particularly the components that generate the most heat.

In each of these examples of the thermal management systems 1910, 1940 and 1960, the ability to customize the surface geometry of the 3D vapor chambers 1915, 1945 and 1965 to the circuit card components optimizes the thermal management and allows for higher density of components and components with greater temperatures. The circuit cards 1920, 1950 and 1970 and components 1925, 1955 and 1975 in one example have a standard layout such that multiple boards can be accommodated by a single heatframe design. In addition, the integral design of corresponding mounting features (not shown) into their respective heatframes (not shown) allows for improved mating with the boards 1920, 1950 and 1970, thereby eliminating the conventional wedgelock. Furthermore, the ability to integrally design the fins (not shown) and chassis (not shown) to the heatframes (not shown) allows for customization for the intended heat dissipation for specific circuit cards and components. A result of the thermal management structures 1910, 1940 and 1960 that allows for smaller heatframes when thermal characteristics are not high and for larger heatframes and fins for components that generate more heat. According to one example, the 3D vapor chambers 1915, 1945 and 1965 in the integral thermal management structures 1910, 1940 and 1960 are made using additive manufacturing technology such as 3D printing.

Figure 20:
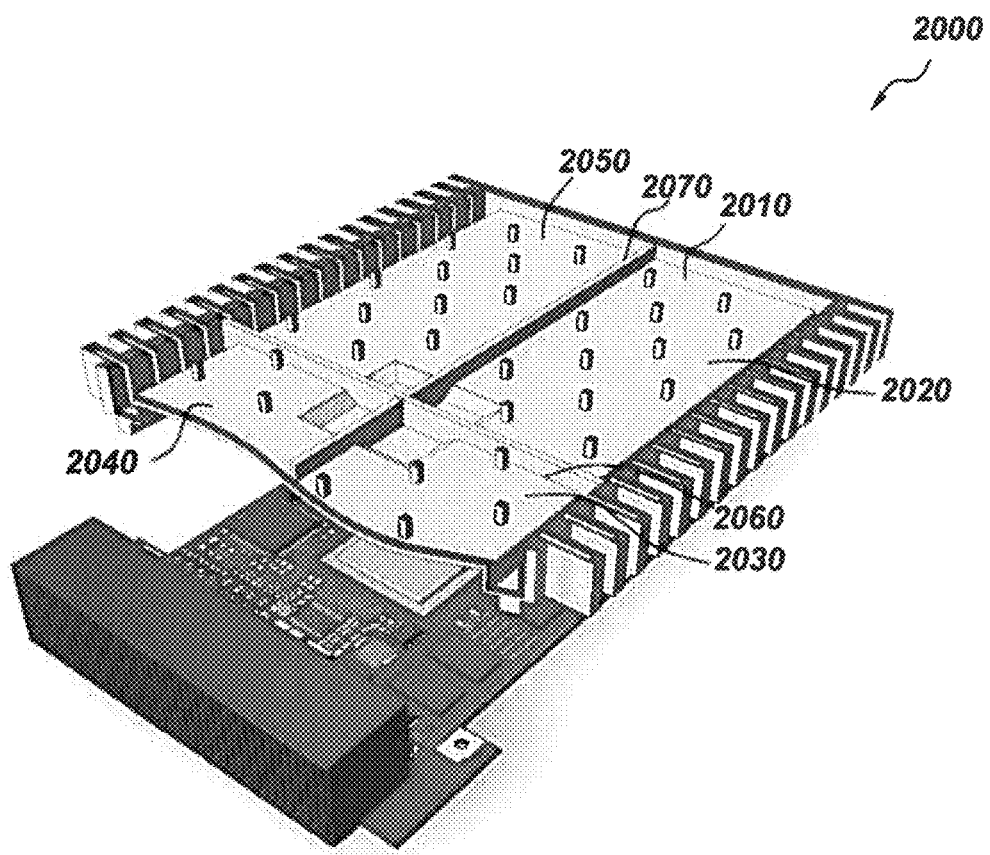
FIG. 20 shows a thermal management system with a compartmentalized vapor chamber including several compartments partitioned within the same vapor chamber and adjacent to each other.

FIG. 20 shows an alternative configuration of the compartmentalization of the vapor chamber in a horizontal plane. Referring to FIG. 20, such a thermal management system 2000 includes a larger, compartmentalized vapor chamber 2010. The bigger vapor chamber 2010 is divided into several compartments 2020, 2030, 2040, 2050 and so on using partitions 2060, 2070 and so on. The compartments 2020, 2030, 2040, 2050 may be equal or unequal in size depending on the design purpose. Further, each of the compartments 2020, 2030, 2040, 2050 may be designed to serve/cool the specific electronics coupled to the respective vapor chambers. The compartmentalization of the vapor chambers allows at least some of the vapor chambers to function if one or more compartments are compromised. At the same time, the compartments 2020, 2030, 2040, 2050 share common boundary walls and are unified by the structural integrity and rigidity of the bigger vapor chamber 2010.

Figure 21E:
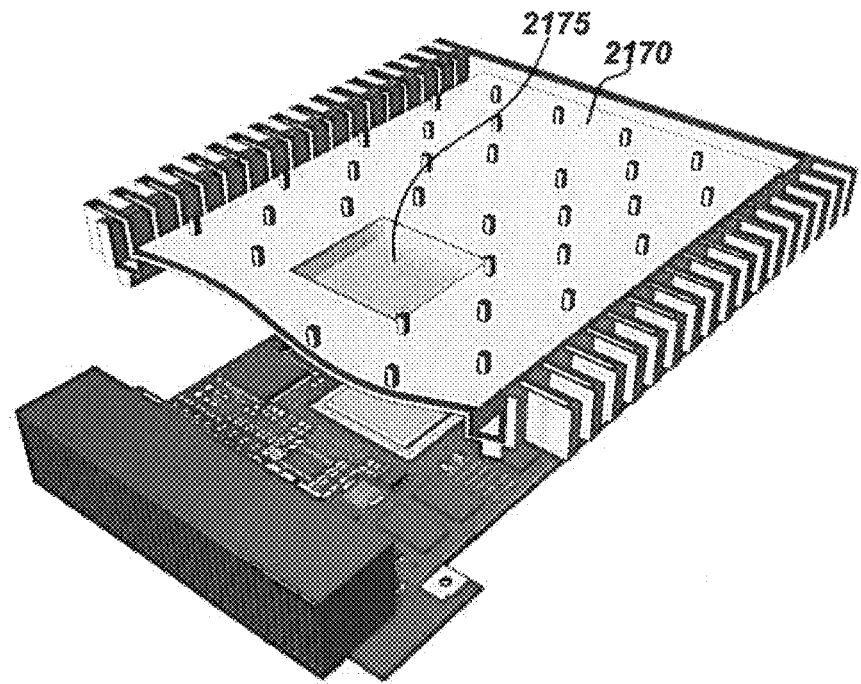
Figure 21F:
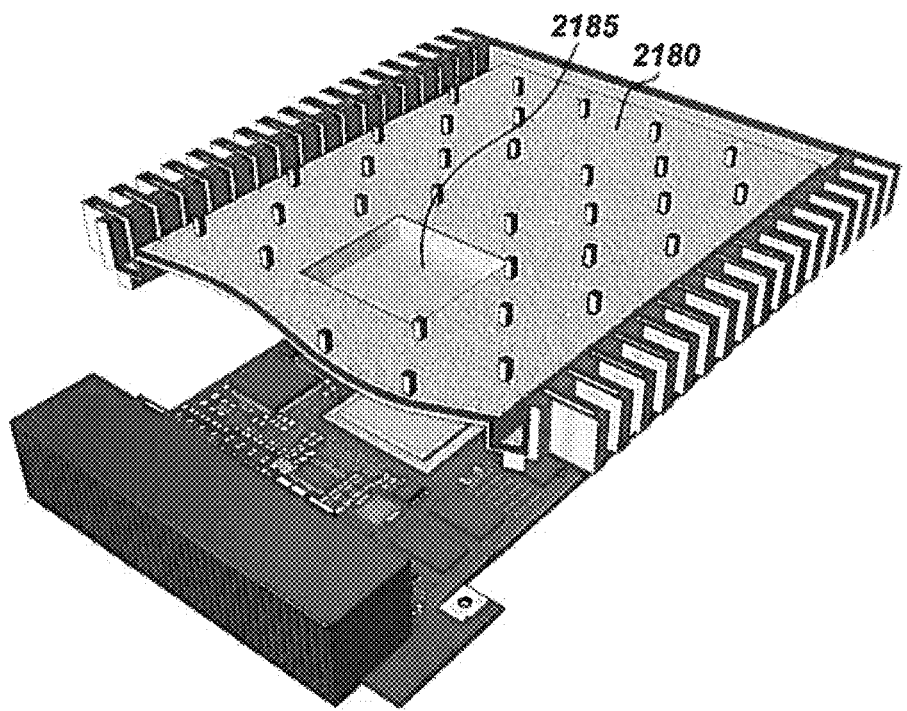

FIGS. 21A-21F is another example of the modular vapor chamber with complaint wall and 3D wick structures. Referring to FIG. 21A, the modular vapor chamber 2100 includes wall (vapor chamber case) 2110 and 3D wick structures 2130 and 2140. As for the wall 2110, it conforms to the top of the electronic components represented by an angled rectangle 2120. The rectangle 2120 is typically angled/slanted because the electronic components are "tipped" relative to PCB due to manufacturing tolerances and thus may have a non-horizontal top-profile. Operationally, the vapor chamber case 2110 needs to adapt to the angled top-profile and at least that area of the vapor chamber case wall is made compliant. Exaggerated representation of ridges 2115 in the vapor chamber case 2110 enable the desired compliance without plastic deformation. In other examples, in addition to the wall 2110, the 3D wick structures 2140 associated with the compliant part of the wall 2110 are also made compliant. Referring to FIG. 21A once more, 2130 refers to the number of 3D wick structures that are rigid/non-compliant and 2140 to the number of 3D wick structures that are compliant. By construction, the 3D wick structures in area 2130 are typically connected to each other internally whereas the 3D wick structures in area 2140 are unconnected. There are various ways these complaint parts of the vapor chamber case 2110 and the 3D wick structures 2140 can be permuted and combined as described below.

FIG. 21B represents an example of the modular vapor chamber with 3D wick structures 2140 having uniform pore size all through and the structure posts 2145 positioned at relatively uniform distance from each other. FIG. 21C represents an example of the modular vapor chamber with 3D wick structures 2140 having small pores near the top, large pores near the vapor chamber case. In such a configuration, the structure posts 2155 are positioned such that there are relatively smaller gaps through the structures at the top and larger gaps at the bottom. FIG. 21D represents an example of the modular vapor chamber with 3D wick structures 2140 having large pores near top and small pores near the vapor chamber case. In such a configuration, the structure posts 2165 are positioned such that there are relatively larger gaps through the structures at the top and smaller gaps at the bottom. Further, referring to FIG. 21E, in the vapor chamber case 2170, compliant and unconnected 3D wick structures 2175 are localized only to the component area. Furthermore, referring to FIG. 21F, unconnected 3D wick structures line the whole vapor chamber case 2180 including the unconnected 3D wick structures 2185 making the whole vapor chamber case 2180 compliant.

In operation, according to one embodiment, the thermal management system includes a vapor chamber having a vapor chamber case with a component side and an opposing vapor side, internal 3D wick structures disposed on at least the component side, internal working fluid, and additional internal support structures. The system in one example is made as a single unitary structure, wherein the case, 3D wick structures, and internal support structures are integrally formed during formation by 3D printing or other Additive Manufacturing process. In another example, the system is not made as a single unitary structure. In one such embodiment, the 3D vapor chamber, the 3D wick structures, and the 3D internal support structures are independently formed by precision sintering at least a part of a collection of metal powders during formation of the 3D vapor chamber by 3D printing or other additive Manufacturing process Subsequent to formation of the 3D vapor chamber, the 3D wick structures and the 3D internal support structures, working fluid is typically added to the internal structure until the wick is saturated and then the outer case is sealed. This filling process introduces the working fluid into the case. In certain examples, some of the fluid will be in the liquid state, while some may be in the vapor state. When one part of the thermal management system is thermally connected to a cold reservoir, and another part to a heat source such as electronic components, heat is conducted from the heat source, through adjacent vessel envelope wall, and into the adjacent wick structure which is saturated with liquid. This addition of heat causes the liquid phase of the working fluid to boil into the vapor phase within the vessel. The process is similar to that of an operating heat pipe.

In one embodiment, the 3D wick structure is engineered such that very fine features are present near the heat source, thus increasing the strength of the capillary force. However, the fine structures have a high fluid resistance. Therefore, the 3D wick structure between the cold reservoir and heat source is engineered as a coarse structure with smooth features that minimize the fluid resistance. The fine and coarse structures are engineered to maximize the rate of fluid transport, and thus the optimal amount of heat can be transferred.

In another embodiment, the 3D wick structure between the cold reservoir and heat source includes finer structures close to the vapor gap, and coarser structures close to the vessel wall. The finer structures prevent the liquid phase of the working fluid passing through the wick from interacting with the vapor phase of the working fluid passing through the vapor space in the opposite direction. The coarser structures near the vessel wall allow the liquid to pass through the wick with minimal pressure drop. In one example, the thermal path from the electronic component to the cold reservoir is enhanced by transporting the working fluid (any mix of liquid and vapor) contained within the vapor chamber by means of capillary action through any combination of the 3D wick structure and the internal support structure to dissipate heat from the heatframe.

The assembly in one example enhances the thermal capability and the entire structure is fabricated using additive manufacturing technology to allow for complex geometries that are conformal to the components. Although the figures indicate "pockets" for the hot components, in one exemplary embodiment the vapor chamber case "conforms" to the hot components via "pockets", "planes", or "posts", as needed. According to one example the 3D wick structure is non-uniform 3D wick oriented in the thickness direction. In another example the 3D wick structure is a non-uniform wick having a thickness and planar directions.

In a thermal management system for circuit cards in a chassis, the components have parasitic heat losses that thermally coupled to the device. These losses are removed in order to maintain a proper operating environment for the electronics. In one example the present system moves the heat from the component such as to cold sink reservoirs, thus maintaining the component at low temperature.

The present systems reduce the thermal resistance of this thermal path while maintaining or lowering the weight of the system. Certain technical advantages of the present system include lower weight, lower thermal resistance, unlimited shapes and form factors, unitary single piece construction. Commercial advantages include custom designs, lower price, and more capability and greater thermal elements in the same volume.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A thermal management system for electronics, comprising:
   at least one vapor chamber that at least partially envelops the electronics, wherein the at least one vapor chamber comprises a vapor chamber case with a component side and an opposing vapor side;

a working fluid contained within the vapor chamber, introduced into the vapor chamber case and used to dissipate heat from at least a part of a heated portion of the electronics; and a precision sintered 3D wick structure independently created on at least some of the interior of the vapor chamber, deployed within the internal space of the vapor chamber and disposed on at least the component side of the vapor chamber case, wherein the precision sintered 3D wick structure transports the working fluid by capillary action from at least one working fluid receptacle to the at least a part of the heated portion of the electronics, wherein the precision sintered 3D wick structure comprises a plurality of layers of metal build powder particles, wherein a first collection of metal build powder particles from each of a first group of layers from the plurality of layers of metal build powder particles is sintered to create a 3D porous zone, and further wherein a second collection of metal build powder particles from each of a second group of layers from the plurality of layers of metal build powder particles is melted to create a 3D nonporous zone.

2. The system according to claim 1, wherein the first collection of metal build powder particles from each of the first group of layers from the plurality of layers of metal build powder particles is sintered by applying a first predetermined laser spot input power corresponding to a first combination of laser parameters, the first predetermined laser spot input power being between about 60 watts and about 80 watts, wherein the second collection of metal build powder particles from each of the second group of layers from the plurality of layers of metal build powder particles is melted by applying a second predetermined laser spot input power corresponding a second combination of laser parameters, and wherein the second predetermined laser spot input power is greater than the first predetermined laser spot input power.

3. The system according to claim 2, wherein each of the first combination of laser parameters and the second combination of laser parameters comprises at least one of: laser spot size, laser velocity, hatch spacing, build layer thickness, build powder particle size, and build powder distribution.

4. The system according to claim 2, wherein the metal build powder particles comprise metal build powder particles with diameter between 10 microns and 250 microns, and wherein the the second predetermined laser spot input power is about 110 watts.

5. The system according to claim 4, wherein the vapor chamber envelops the electronics in one of: reverse-conformal, and custom-conformal surface geometry.

6. The system according to claim 1, further comprising one or more precision sintered 3D internal support structures within the vapor chamber, wherein the precision sintered 3D internal support structure supports the vapor chamber structurally from within.

7. The system according to claim 1, wherein the vapor chamber is formed by additive manufacturing process.

8. A closed 3D vapor chamber formed by additive manufacturing, comprising:

a vapor chamber case with a component side and an opposing vapor side;

a working fluid contained within the closed 3D vapor chamber, introduced into the vapor chamber case and used to dissipate heat from at least a part of a heated portion of a plurality of electronics positioned at least partially within the vapor chamber; and a precision sintered 3D wick structure independently created on at least some of the interior of the closed 3D vapor chamber, deployed within the internal space of the vapor chamber and disposed on at least the component side of the vapor chamber case, wherein the precision sintered 3D wick structure transports the working fluid by capillary action from the at least one working fluid receptacle to the at least a part of the heated portion of the electronics, wherein the precision sintered 3D wick structure comprises a plurality of layers of metal build powder particles, wherein a first collection of metal build powder particles from each of a first group of layers from the plurality of layers of metal build powder particles is sintered to create a 3D porous zone, and further wherein a second collection of metal build powder particles from each of a second group of layers from the plurality of layers of metal build powder particles is melted to create a 3D nonporous zone.

9. The closed 3D vapor chamber according to claim 8, wherein the first collection of metal build powder particles from each of the first group of layers from the plurality of layers of metal build powder particles is sintered by applying a first predetermined laser spot input power corresponding to a first combination of laser parameters, and further wherein the second collection of metal build powder particles from each of the second group of layers from the plurality of layers of metal build powder particles is melted by applying a second predetermined laser spot input power corresponding a second combination of laser parameters.

10. The closed 3D vapor chamber according to claim 9, wherein each of the first combination of laser parameters and the second combination of laser parameters comprises at least one of: input power value, laser spot size, laser velocity, hatch spacing, build layer thickness, build powder particle size, and build powder distribution.

11. The closed 3D vapor chamber according to claim 10, wherein the metal build powder particles comprise metal build powder particles with diameter between 10 microns and 250 microns.

12. The closed 3D vapor chamber according to claim 11, wherein at least part of at least one of: the case of the vapor chamber and the 3D wick structures is compliant, and wherein the vapor chamber envelops the electronics in one of: conformal, reverse-conformal, and custom-conformal surface geometry.

13. The closed 3D vapor chamber according to claim 8, wherein the 3D wick structures are non-uniform, and wherein the plurality of electronics are positioned entirely within the vapor chamber.

14. The closed 3D vapor chamber according to claim 8, further comprising one or more precision sintered 3D support structures within the closed 3D vapor chamber, wherein the precision sintered 3D support structure supports the vapor chamber structurally from within.

15. The closed 3D vapor chamber according to claim 8, wherein the precision sintered 3D wick structure comprises at least one of titanium material and Ti64 build powder.

16. A method of thermal management for electronics, comprising:
- enveloping the electronics at least partially in at least one 3D vapor chamber formed by additive manufacturing, wherein the at least one vapor chamber comprises a vapor chamber case with a component side and an opposing vapor side;
- independently creating a precision sintered 3D wick structure on at least some of the interior of the vapor chamber,
- deploying the precision sintered 3D wick structure within the internal space of the vapor chamber,
- disposing the precision sintered 3D wick structure on at least the component side of the vapor chamber case;
- introducing a working fluid into the vapor chamber case;
- transporting the working fluid through the precision sintered 3D wick structure by capillary action; and
- dissipating heat from at least a part of a heated portion of the electronics to at least one working fluid receptacle,
- wherein the independently creating a precision sintered 3D wick structure on at least some of the interior of the vapor chamber comprises:
- sintering a first collection of metal build powder particles from each of a first group of layers from a plurality of layers of metal build powder particles to create a 3D porous zone, and
- melting a second collection of metal build powder particles from each of a second group of layers from the plurality of layers of metal build powder particles to create a 3D nonporous zone.

17. The method according to claim 16, wherein the sintering a first collection of metal build powder particles from each of a first group of layers from the plurality of layers of metal build powder particles comprises sintering by applying a first predetermined laser spot input power corresponding to a first combination of laser parameters;
- the melting a second collection of metal build powder particles from each of a second group of layers from the plurality of layers of metal build powder particles comprises melting by applying a second predetermined laser spot input power corresponding to a second combination of laser parameters, and
- wherein the second predetermined laser spot input power is greater than the first predetermined laser spot input power.

18. The method according to claim 17, wherein each of the first combination of laser parameters and the second combination of laser parameters comprises at least one of: input power value, laser spot size, laser velocity, hatch spacing, build layer thickness, build powder particle size, and build powder distribution.

* * * * *